US012560984B2

(12) United States Patent
Yang

(10) Patent No.: US 12,560,984 B2
(45) Date of Patent: Feb. 24, 2026

(54) M.2 CARD ADAPTER AND HEATSINK

(71) Applicant: HEWLETT PACKARD ENTERPRISE DEVELOPMENT LP, Spring, TX (US)

(72) Inventor: Shou-Jen Yang, New Taipei (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 261 days.

(21) Appl. No.: 18/494,891

(22) Filed: Oct. 26, 2023

(65) Prior Publication Data

US 2025/0138599 A1 May 1, 2025

(51) Int. Cl.
| | |
|---|---|
| *G06F 1/00* | (2006.01) |
| *G06F 1/183* | (2026.01) |
| *G06F 1/20* | (2006.01) |
| *H05K 7/14* | (2006.01) |
| *H05K 7/20* | (2006.01) |

(52) U.S. Cl.
CPC .............. *G06F 1/183* (2013.01); *G06F 1/20* (2013.01); *H05K 7/1402* (2013.01); *H05K 7/2039* (2013.01)

(58) Field of Classification Search
CPC ........... G06F 1/183; G06F 1/20; G06F 1/185; H05K 7/1402; H05K 7/2039
USPC ......................................................... 361/715
See application file for complete search history.

(56) References Cited

U.S. PATENT DOCUMENTS

| | | |
|---|---|---|
| 11,275,415 B2 * | 3/2022 | Dallaserra ................. G06F 1/20 |
| 11,553,625 B2 | 1/2023 | Chang et al. |
| 2017/0262029 A1 * | 9/2017 | Nelson ...................... G06F 1/20 |
| 2020/0137896 A1 * | 4/2020 | Elenitoba-Johnson ..................... G06F 13/4221 |
| 2021/0123449 A1 | 4/2021 | Fukami et al. |
| 2021/0259135 A1 * | 8/2021 | Kim .......................... G06F 1/20 |
| 2022/0030748 A1 * | 1/2022 | Chang ................ H05K 7/20709 |
| 2023/0006375 A1 * | 1/2023 | Chauhan .............. H01R 12/714 |

FOREIGN PATENT DOCUMENTS

| | | |
|---|---|---|
| CN | 111221395 A | 6/2020 |
| KR | 10-2021-0002458 A | 1/2021 |

* cited by examiner

*Primary Examiner* — Zhengfu J Feng
(74) *Attorney, Agent, or Firm* — Jones Robb PLLC

(57) ABSTRACT

An M.2 adapter/heatsink comprises a heat spreader clip configured to receive M.2 modules having multiple M.2 module lengths. The M.2 adapter/heatsink also comprises an adapter fastener and a spacer. The adapter fastener can be attached to the heat spreader clip at any one of a plurality of attachment locations corresponding respectively to the different M.2 module lengths. When an M.2 module is received in the clip, the adapter fastener is attached to clip at the attachment location which corresponds to the length of the M.2 module. The adapter fastener engages with the M.2 mount of the M.2 module, thus attaching the M.2 module to the clip. The spacer is attached to the heat spreader clip and located such that a replica M.2 mount of the spacer can be connected to PCA by a fastener. Thus, the spacer attaches the clip, and hence also the M.2 module (indirectly), to the PCA.

20 Claims, 13 Drawing Sheets

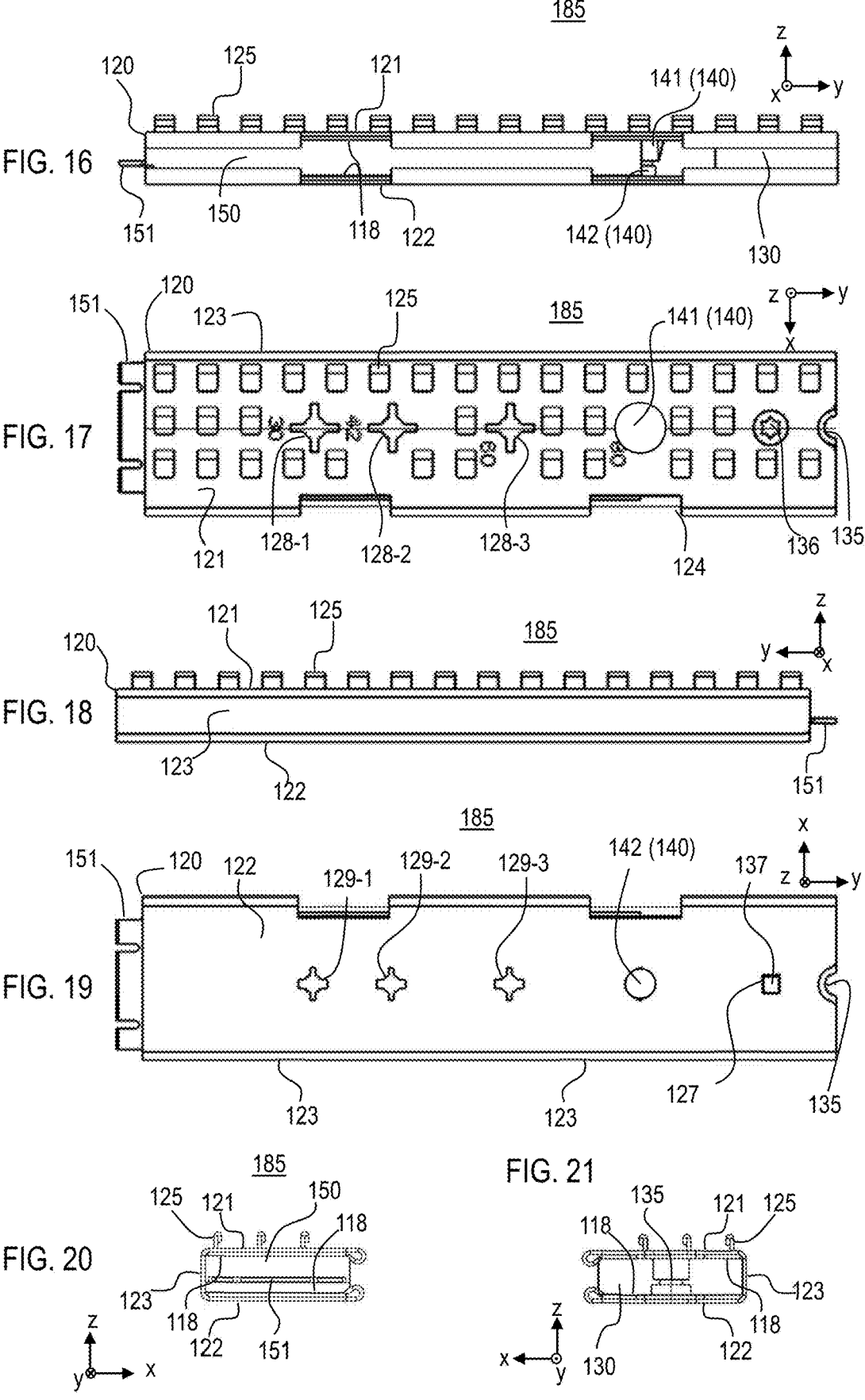

M.2 CARD ADAPTER AND HEATSINK

INTRODUCTION

M.2 is a specification for computer expansion cards and associated connectors. The expansion cards compliant with the M.2 specifications may be referred to herein as M.2 cards or M.2 modules, and may include things such as storage modules (e.g., solid state drives (SSDs)), WiFi modules, Bluetooth modules, near field communication (NFC) modules, etc. The M.2 specification relates to both the physical form factor and the electrical connectivity of the M.2 modules. A number of different sizes of M.2 modules are available, including widths of 12, 16, 22, or 30 mm and lengths of 16, 26, 30, 38, 42, 60, 80, or 110 mm.

The M.2 modules have an edge-style electrical connector at one width-wise edge and an M.2 mount at the opposite width-wise edge. The M.2 mount comprises a semi-circular hole and a rim/lip which defines the hole. The M.2 module is installed on a host printed circuit assembly (PCA) by connecting the edge connector into an electrical connector of the host PCA and connecting the M.2 mount to the PCA via a fastener. The fastener comprises a standoff and a set screw. The standoff is attached to the PCA at a predetermined position arranged such that, with the edge connector connected to the electrical connector, the M.2 mount is aligned with and rests atop the standoff. The set screw is inserted through the semi-circular hole and engaged with the standoff such that, when tightened down, the rim/lip around the semi-circular hole is clamped between the set screw and the standoff. In this manner, the M.2 module is secured to the PCA and supported at two opposite width-wise edges thereof: one edge is connected to and supported by the electrical connector and the other edge is connected to and supported by the fastener.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operations. In the drawings:

FIG. 16 is a front view of the M.2 adapter/heatsink and the first M.2 module of FIG. 15.

FIG. 17 is a top view of the M.2 adapter/heatsink and the first M.2 module of FIG. 15.

FIG. 18 is a rear view of the M.2 adapter/heatsink and the first M.2 module of FIG. 15.

FIG. 19 is a bottom view of the M.2 adapter/heatsink and the first M.2 module of FIG. 15.

FIG. 20 is a left side view of the M.2 adapter/heatsink and the first M.2 module of FIG. 15.

FIG. 21 is a right side view of the M.2 adapter/heatsink and the first M.2 module of FIG. 15.

DETAILED DESCRIPTION

Figure 1:
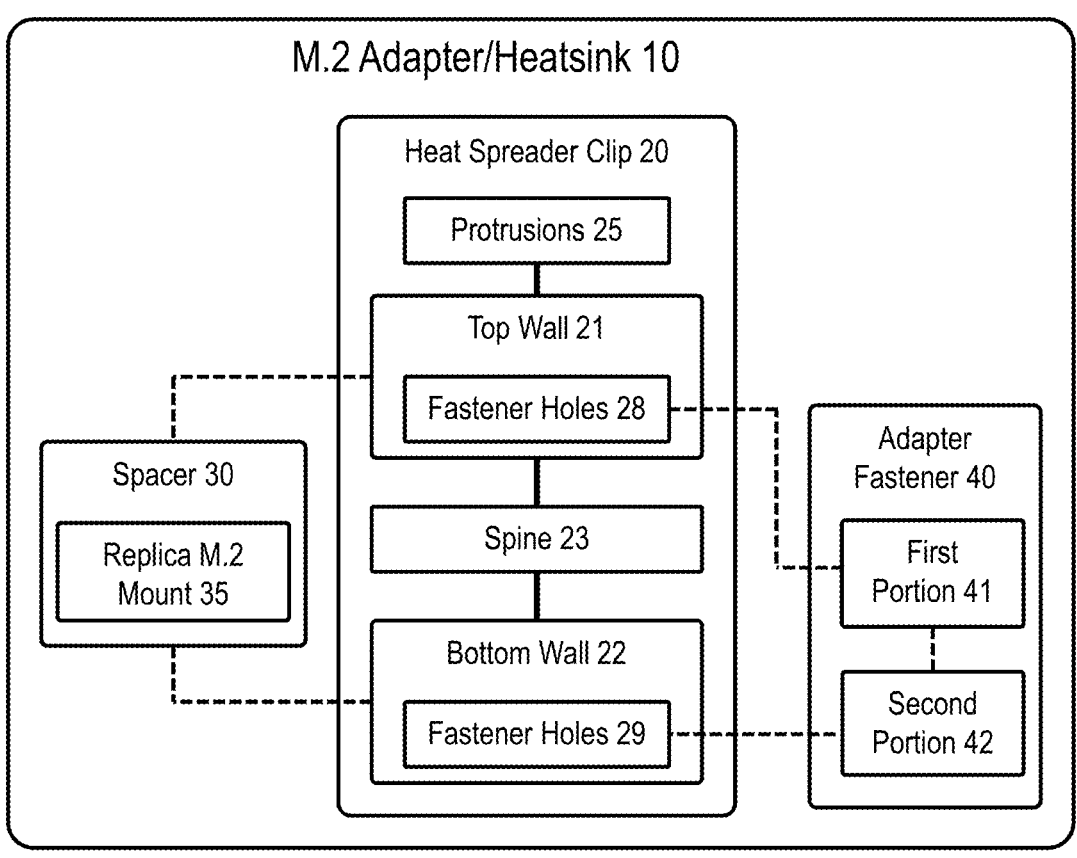
FIG. 1 is a block diagram schematically illustrating an example M.2 adapter/heatsink.

M.2 modules may generate heat while in use. For example, in M.2 SSD modules, a storage controller of the module may generate substantial heat. Thus, to keep the storage controller's temperature within a desired range, the heat generated thereby needs to be removed. One way to remove such heat is to dissipate the heat into air flowing around the module. However, in some cases, the air flowing around the module cannot dissipate the heat fast enough to adequately cool the devices because the surface area of the heat generating components which is exposed to the airflows is too small. Generally, the greater the surface area of a component that is exposed to the airflows, the greater the rate at which heat can be dissipated from the component into the airflows. Accordingly, to ensure adequate cooling of the M.2 modules, a manufacturer of a computing device may attach a heatsink to the M.2 modules, with the heatsink being configured to spread out the heat generated by the components over a larger surface area and thus produce a greater rate of heat transfer into the air flows.

As noted above, M.2 modules come in a variety of different sizes, and it is not uncommon for a manufacturer of computing devices to use multiple different sizes of M.2 modules in their systems. One reason that the manufacturers may utilize multiple differently sized M.2 modules is to provide greater choice and flexibility for customers. Another reason is that the manufacturers may source M.2 modules from multiple different suppliers (e.g., to ensure that shortages or failures of one supplier do not disrupt the manufacture's operations), and these different suppliers of M.2 modules may provide different sized modules.

However, one problem that can arise from attempting to accommodate multiple different sizes of M.2 modules is that each M.2 module size may require a different heatsink to fit the particular dimensions of the respective M.2 module. Thus, a manufacturer of a computing system may need to design, produce, and/or keep in stock multiple different models of M.2 heatsinks. Designing and producing multiple models of M.2 heatsinks increases manufacturing costs, for example due to needing different tooling for each model. In addition, having multiple models of M.2 heatsinks increases the number of SKUs in use, which can increase logistical costs.

Accordingly, it may be desired to be able to use the same design of heatsink for multiple differently sized M.2 modules. However, this can be challenging due to the differing dimensions of the M.2 modules. For example, a long heatsink which fits a long M.2 module may not be usable with a shorter M.2 module because the longer heatsink may extend out beyond the distal end of the shorter M.2 module, thus blocking access to the M.2 mount of the shorter M.2 module and thereby preventing attachment of the module to a PCA. On the other hand, if a shorter heatsink is used to avoid blocking the M.2 mounts of the shorter modules, then a longer M.2 module may be inadequately cooled because the smaller heatsink might not fully cover the larger M.2 module and therefore the heatsink may not thermally couple with some of the heat generating components of the larger M.2 module. Moreover, the smaller heatsinks may have smaller surface area and thus may not provide a heat transfer rate that is sufficient for a larger M.2 module. set of compatible M.2 module sizes To address these and other issues, examples disclosed herein comprise an M.2 adapter/heatsink which is compatible with multiple different M.2 module sizes. These M.2 module sizes may be referred to herein as a set of compatible M.2 module sizes, a set of compatible sizes, the compatible M.2 module sizes, or the compatible sizes. M.2 modules having one of the compatible sizes may be referred to as a set of compatible M.2 modules or compatible M.2 modules. The M.2 adapter/heatsink being compatible with the set of compatible sizes means that the M.2 adapter/heatsink is capable of securely attaching any M.2 module that has one of the compatible sizes to the host PCA and also providing adequate cooling for each such module. The M.2 adapter/heatsink may serve as both an adapter and a heatsink. The M.2 adapter/heatsink acts as an adapter in that it facilities attachment any of the compatible M.2 modules to a PCA regardless of the respective size of the M.2 module (as long as it is one of the compatible M.2 module sizes), and the M.2 adapter acts as a heatsink in that it can be thermally coupled to the heat generating components of the M.2 module to facilitate heat transfer into the surrounding air. In particular, the M.2 adapter/heatsink comprises a heat spreader clip which is configured to clamp around the M.2 module, a spacer that is selectively attachable to the heat spreader clip, and an adapter fastener that is selectively attachable to the heat spreader clip at any of a plurality of mounting locations corresponding to the different sizes of M.2 modules.

The heat spreader clip may have a length similar to that of the longest M.2 module in the set of compatible sizes, and therefore the heat spreader clip is also able to fully cover any of the other compatible M.2 module sizes. Because the heat spreader can fully cover all of the compatible M.2 modules sizes, it can thermally couple with all of the heat generating components on any of the compatible M.2 modules, ensuring adequate cooling is provided for each M.2 module. Moreover, because the heat spreader is sized to match the largest M.2 module in the set, the surface area thereof is maximized, thus further enhancing cooling efficiency.

In addition, the adapter fastener and the spacer allow for secure attachment to a PCA of each of the compatible M.2 modules regardless of their size (as long as it is with in the set of compatible sizes). Specifically, if the longest M.2 module is installed, the distal end of the M.2 module extends just beyond the distal end of the heat spreader clip and the M.2 mount of the M.2 module can be fastened directly to the PCA. However, if an M.2 module that is shorter than the longest M.2 modules is used, then the adapter fastener may be used to attach the shorter M.2 module to the heat spreader clip, and the spacer may be used to fasten the heat spreader clip to the PCA, thus indirectly securing the M.2 module to the PCA via the M.2 adapter/heatsink. In particular, the adapter fastener is configured to be selectively attached to the heat spreader clip at one of a set of predetermined mounting locations (e.g., mounting holes) and, in this position, to engage the M.2 mount of the M.2 module. The predetermined mounting locations correspond, respectively, to the compatible M.2 module sizes and are arranged so as to align with the M.2 mount of the corresponding M.2 module when the corresponding M.2 module is installed in the M.2 adapter/heatsink. Thus, when a given M.2 module is installed, the adapter fastener can be engaged with the M.2 mount thereof by installing the adapter fastener at the corresponding mounting location. Furthermore, the spacer may be attached to the heat spreader clip near the distal end thereof, and the spacer is in turn attached to the PCA. The spacer may have a replica M.2 mount formed therein which is attached to the PCA using the same M.2 fastener that would be used for the longer M.2 module. Thus, the M.2 module is attached to the heat spreader clip (via the adapter fastener), which is attached to the spacer, which is attached to the PCA, and therefore the M.2 module is indirectly attached to the PCA via the M.2 adapter/heatsink. Accordingly, although the heat spreader clip may extend beyond the distal end of the shorter M.2 module and thus block the M.2 mount thereof, preventing the possibility of directly mounting the M.2 module to the PCA, nevertheless the adapter fastener and spacer allow the shorter M.2 to be securely attached (indirectly) to the PCA.

Thus, because a single heatsink design can be used with multiple different sizes of M.2 module, fewer types of heatsinks may be needed (in some cases, a single heatsink model may cover all of the needs of a manufacture) and therefore manufacturing and logistical costs can be reduced. Furthermore, the M.2 adapter/heatsink achieves this while providing adequate cooling and secure attachment for each of the differently sized M.2 modules notwithstanding their different dimensions.

In addition, the M.2 adapter/heatsink may allow the PCA to which the M.2 modules are to be attached to be simplified, which further reduces manufacturing costs. Specifically, if multiple different sizes of M.2 module are to be used, the PCA may need to be configured with multiple different mounting points at which fasteners can be attached to account for the different locations of the M.2 mounts of differently sized M.2 modules. These multiple mounting points take up valuable PCA space and limit the PCA design. In contrast, with the M.2 adapter/heatsink, there needs to be only one attachment point which can be used for all of the different compatible sizes of M.2 module.

Turning now to the figures, various devices, systems, and methods in accordance with aspects of the present disclosure will be described.

Figure 2:
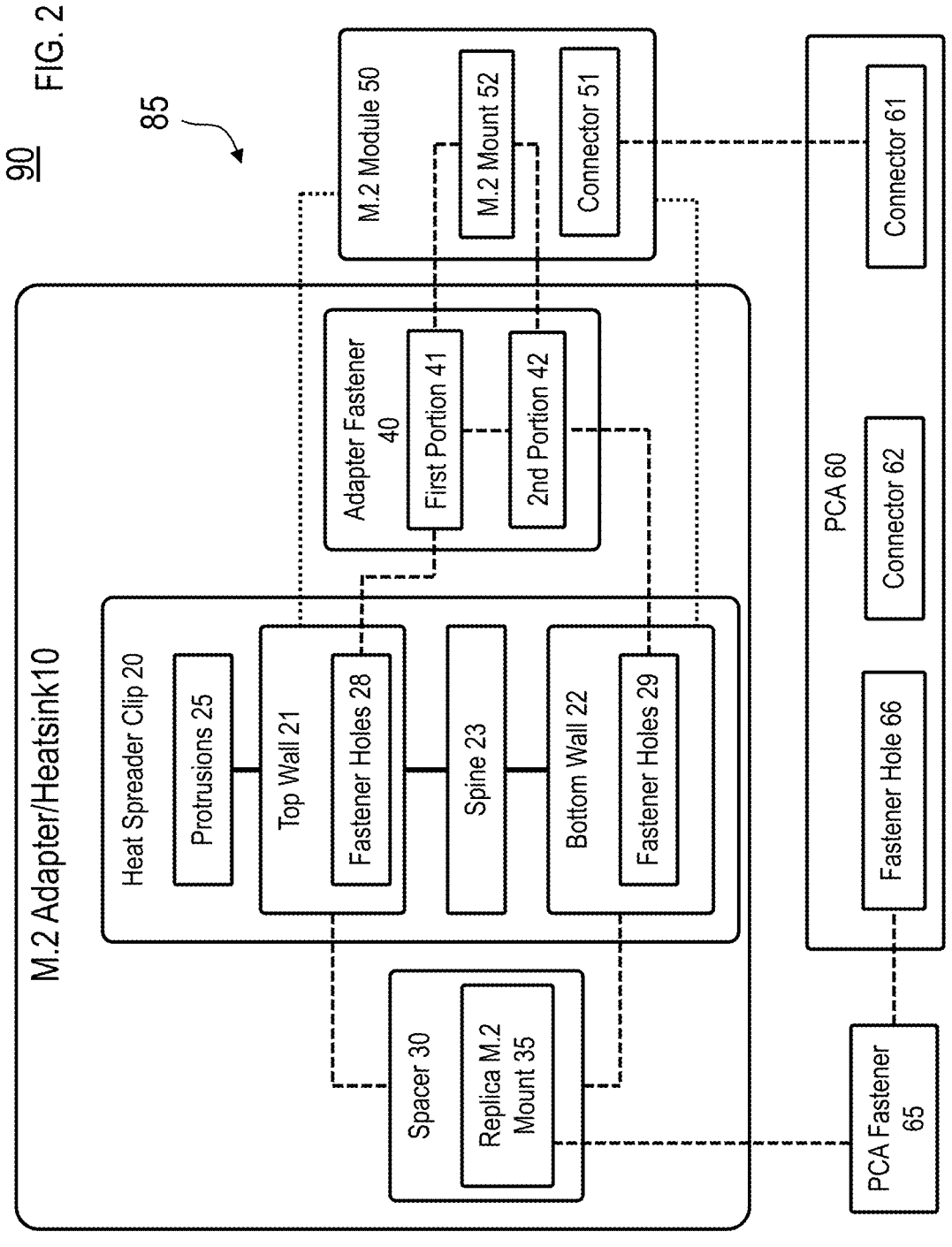
FIG. 2 is a block diagram schematically illustrating a system comprising the M.2 adapter/heatsink of FIG. 1.

FIG. 1 is a block diagram schematically illustrating an M.2 adapter/heatsink 10, and FIG. 2 is a block diagram schematically illustrating a system 90 comprising the same M.2 adapter/heatsink 10. It should be understood that FIGS. 1 and 2 are not intended to illustrate specific shapes, dimensions, or other structural details accurately or to scale, and that implementations of the M.2 adapter/heatsink 10 and system 90 may have different numbers and arrangements of the illustrated components and may also include other parts that are not illustrated. In FIGS. 1 and 2, attachment/connection between components is indicated conceptually by lines (both solid and dashed), with dashed lines indicating that a connection is selective, optional, and/or reversible (e.g., the connection may be established in some states while not in others), and thermal coupling between components is indicated by dotted lines. Thermal coupling between two components may include direct contact therebetween, or mutual contact with thermally conductive intermediaries, such as a thermal interface material (TIM).

As shown in FIG. 1, the M.2 adapter/heatsink 10 comprises a heat spreader clip 20. The heat spreader clip 20 comprises a top wall 21, a bottom wall 22, and a spine 23. In some examples, the top wall 21, bottom wall 22, and spine 23 may be integrally connected parts, meaning that they are part of the same unitary body (as opposed to being physically separate parts which have been joined together). For example, in some implementations the top wall 21, bottom wall 22, and spine 23 are formed from a single piece of sheet metal which has been bent and/or otherwise formed into the shape of the heat spreader clip 20. The top wall 21 and bottom wall 22 are arranged substantially parallel to one another. The spine 23 is perpendicular to and extends between the top wall 21 and the bottom wall 22, with the spine 23 being attached to the top and bottom walls 21 and 22 at lateral edges thereof, which may be referred to hereinafter as the attached edges of the walls 21 and 22. Thus, the heat spreader clip 20 has a generally C- or U-shaped cross-section. The space between the top and bottom walls 21 and 22 is configured to receive an M.2 module, with the two broadest faces of the M.2 module abutting the top and bottom walls 21 and 22 respectively. In this context, the two broadest faces of the M.2 module abutting the top and bottom walls 21 and 22 means they are positioned opposite from one another and are either in direct contact with one another or are in mutual contact with a TIM disposed therebetween. In some examples, the attached edges of the top and bottom walls 21 and 22 are lateral edges which extend parallel to a longitudinal (lengthwise) dimension of the heat spreader clip 20, which also corresponds to the longitudinal dimensions of the M.2 modules when installed in the M.2 adapter/heatsink 10.

The heat spreader clip 20 is formed from thermally conductive materials. In some examples, the heat spreader clip 20 is formed from copper (or an alloy thereof), aluminum (or an alloy thereof), brass (or an alloy thereof), nickel (or an alloy thereof), zinc (or an alloy thereof), stainless steel, another thermally conductive metal (or an alloy thereof), or a thermally conductive plastic. In some examples, the heat spreader clip 20 is formed from a highly thermally conductive material (defined below), such as certain forms of copper or aluminum.

The heat spreader clip 20 is also configured to thermally couple with the M.2 modules when the modules are installed in the heat spreader clip 20. Specifically, the heat spreader clip 20 is configured such that each of the top and bottom walls 21 and 22 is either: (1) in direct contact with the M.2 modules installed in the clip 20, or (2) indirectly in contact with the M.2 modules via mutual contact with a thermally conductive intermediary, such as a TIM, which is disposed between respective wall and the M.2 module.

In some examples, the heat spreader clip 20 is configured to act like a spring clip which generates spring forces that clamps the top and bottom walls 21 and 22 against opposite faces of the M.2 module (directly, or via a TIM). More specifically, the top and bottom walls 21 are spring biased towards a resting position in which free edges of the top and bottom walls 21 and 22 (i.e., the edges opposite from the attached edges which are attached to the spine 23) are a first distance apart, but when the M.2 module is installed the top and bottom walls 21 and 22 may be deflected away from the resting position to a position in which the free edges of the top and bottom walls 21 and 22 are a second distance apart, which is greater than the first distance. Thus, due to this deflection, spring forces are generated which urges the top and bottom walls 21 and 22 back toward the resting position, and thus the top and bottom walls 21 are pressed against the opposite faces of the M.2 module. This clamping action may help to ensure good thermal contact between the clip 20 and the M.2 module, whether that be direct contact or indirect contact via a TIM.

The above-described thermal coupling of the heat spreader clip 20 to the M.2 module allows the heat spreader clip 20 to absorb heat from heat generating components of the M.2 modules, such as storage controllers or other heat generating components. The heat spreader clip 20 spreads this absorbed heat out over the surface of the heat spreader clip 20 via conduction through the heat spreader clip 20, and then the heat spreader clip 20 dissipates the heat into the cooling airflows that flow around and impinge upon the clip 20. Because the absorbed heat is spread out across the heat spreader clip 20, which has a relatively large surface area compared to the surface area of the heat generating components, the heat can be transferred from the clip 20 into the air at a much higher rate than could be achieved if the heat generating components were merely exposed directly to the cooling air flows (rate of heat transfer into air depends on the area of contact between the air and the body transferring the heat into the area). The thermal interface between the heat generating components and the clip 20, and the conduction of the heat through the clip 20, will impose some resistance to heat flow (every thermal interface does). However, because the clip 20 is formed from thermally conductive materials, the resistance to heat transfer can be relatively small and the improvements in heat dissipation rates into the surrounding air can more than make up for these other losses. Thus, the heat spreader clip 20 allows for relatively high rates of heat transfer from the M.2 modules into the surrounding air, and these rates may be much higher than could be achieved if the M.2 modules were exposed directly to the cooling airflow without the clip 20.

As shown in FIG. 1, the heat spreader clip 20 also may comprise protrusions 25, which are attached to one or both of the top wall 21 and the bottom wall 22. These protrusions may protrude from the face(s) of the top wall 21 and/or bottom wall 22 to facilitate better heat transfer into the surrounding air. These protrusions may improve heat transfer because they protrude into the air flowing around the heat spreader clip 20, thus allowing for more air to make contact with the heat spreader clip 20—in other words, the protrusions increase the total contact area between the flowing air and the heat spreader clip 20. The protrusions may include, for example, folded fins, skived fins, molded/cast fins, pin arrays, or any other type of protrusion. In some examples, the protrusions (e.g., fins) are integrally coupled to the top wall 21 and/or bottom wall 22, meaning they are formed from the same unitary body. For example, in some implementations the top wall 21 and/or bottom wall 22 comprise planar pieces of sheet metal and the protrusions 25 comprise folded fins which are stamped from the sheet metal—e.g., the protrusions may be partially cut out from the remainder of the sheet with one end of each protrusion remaining integrally connected to the remainder of the sheet, and then the cut portion of may be folded so that it extends perpendicularly from the remaining planar portion of the sheet. In other examples, the protrusions (e.g., fins) may be parts that are formed separately from the top wall 21 and/or bottom wall 22 and are later attached thereto, for example via solder, brazing, welding, adhesives, mechanical fasteners, or any other fastening technique.

The rate of heat transfer between M.2 modules and the air via the clip 20 can be tuned to a desired level by changing properties of the clip 20 and/or the TIM used between clip and the M.2 module. In particular, the rate of heat transfer may depend on: the surface area of the clip 20, which may be tunable, for example, by configuring the number, size, and/or shape of the protrusions 25; the thermal conductivity of the materials used for the clip 20; and the heat transfer rate of the thermal interface between clip 20 and M.2 module, which may be tuned, for example, by changing the TIM. Thus, a desired heat transfer rate for the clip 20 may be balanced against other factors (like cost) depending on the goals and constraints of the particular implementation.

In some examples, removable handles (not illustrated) may be attached to the heat spreader clip 20 and configured to be actuatable by a user to spread apart the top and bottom walls 21 and 22, thus allowing the M.2 module to be inserted into the space between the top and bottom walls 21 and 22. For example, the handles may be attached to the free edges of the top and bottom walls 21 and 22 and arranged to act as levers which use the top and bottom walls 21 and 22 as fulcrums such that squeezing the free ends of the handles together forces the free edges of the top and bottom walls 21 and 22 to move away from one another. After the M.2 module is inserted into the clip 20, the handles may be released to allow the spring force to press the top and bottom walls 21 and 22 against the M.2 module, whereupon the handles may be removed from the clip 20.

As described above, when the M.2 adapter/heatsink 10 is used and any of the sizes of M.2 modules is installed therein other than the largest size, the M.2 module is not coupled directly to the PCA. Instead, the M.2 module is coupled to the heat spreader clip 20 via an adapter fastener 40 which engages with fastener holes 28/29 in the clip 20, and then the adapter/heatsink 10 is attached to the PCA via a spacer 30. Thus, the M.2 modules are indirectly coupled to the PCA via the M.2 adapter/heatsink 10. If the largest M.2 module is used, then the fastener 40 and the spacer 30 are omitted and the M.2 module can be coupled directly to the PCA.

As shown in FIG. 1, the top wall 21 comprises a plurality of fastener holes 28. Similarly, the bottom wall 22 comprises a plurality of fastener holes 29. The plurality of fastener holes 28 are distributed along a length dimension of the top wall 21, and the plurality of fastener holes 29 are distributed along a length dimension for the bottom wall 22, with each fastener hole 28 being aligned with a corresponding fastener hole 29 to form a pair. Each pair of fastener holes 28/29 corresponds to one of the M.2 sizes of the set of compatible M.2 sizes and is positioned so as to align with the M.2 mount of the corresponding M.2 module when the module is installed in the clip 20. That is, if a first size of M.2 module is installed, the M.2 mount thereof is aligned with a first pair of the fastener holes 28/29; if a second size of M.2 module is installed, the M.2 mount thereof is aligned with a second pair of the fastener holes 28/29; and so on for each size of M.2 module in the set of compatible modules except for the longest module, which does not have a corresponding pair of fastener holes 29/29. In some examples, there are five compatible sizes of M.2 modules in the set, and thus there are four pairs of fastener holes 28/29 distributed along the length of the clip 20. For example, in some implementations the set of compatible module sizes include modules having lengths of 30, 42, 60, 80, and 110 mm, and pairs of fastener holes 28/29 are arranged at positions corresponding to the M.2 mounts of 30, 42, 60, and 80 mm length modules.

The adapter fastener 40 is configured to be selectively installable at any one of the pairs of fastener holes 28/29. When the adapter fastener 40 is installed at a given pair of fastener holes, a first portion 41 of the adapter fastener 40 engages with the fastener hole 28 in the top wall 21 and a second portion 42 of the adapter fastener 40 engages with the fastener hole 29 of the bottom wall 22, and in this manner the adapter fastener 40 is attached to the heat spreader clip 20. For example, the first portion 41 and the second portion 42 of the adapter fastener 40 may each comprise a columnar standoff with snap-fit features disposed at one end thereof. The fastener holes 28 and 29 may be configured as snap-fit holes which interface with the snap-fit features of the first portion 41 and second portion 42, respectively, to attach the first portion and second portion 42 to the top wall 21 and bottom wall 22, respectively. For example, the first portion 41 of the adapter fastener 40 may be positioned above the top wall 21 and then the first portion 41 is pressed downward into the fastener hole 28, causing the first portion 41 to extend into the interior space between the top and bottom walls 21 and 22 and causing the snap-fit features of the first portion 41 to engage with the fastener hole 28. Conversely, the second portion 42, may be positioned below the bottom wall 22 and then the second portion 42 is pressed upward into the fastener hole 29, causing the second portion 42 to extend into the interior space between the top and bottom walls 21 and 22 and causing the snap-fit features of the second portion 42 to engage with the fastener hole 29. As another example, the first and second portions 41 and 42 of the adapter fastener 40 may comprise threaded screws, and the fastener holes 28 and 29 may comprise threaded screw holes to engage with the threading for the adapter fastener 40.

The first and second portions 41 and 42 of the adapter fastener 40 also comprise engagement surfaces. The engagement surfaces may comprise an end-face of the portion 41 or 42 or an annular ledge, lip, or flange. The engagement surfaces are configured to engage opposite sides of an M.2 mount of an M.2 module in a state of the M.2 module being installed in the clip 20 and the adapter fastener 40 attached to the clip 20. That is, if a given M.2 module is installed in the clip, then as the first portion 41 is inserted into the corresponding fastener hole 28, the engagement surface of the first portion 41 engages (e.g., contacts or abuts) the top surface of the M.2 mount of the given M.2 module, and then as the second portion 42 is inserted into the corresponding fastener hole 29, the engagement surface of the second portion 42 engages (e.g., contacts or abuts) the bottom surface of the M.2 mount of the given M.2 module. Thus, the M.2 mount is clamped between the first and second portions 41 and 42, thereby fastening the M.2 module to the adapter fastener 40. Because the first and second portions 41 and 42 are themselves attached to the clip 20, the M.2 module is also attached to the clip 20 via its engagement with the adapter fastener 40. The same type of attachment may be made for each size of M.2 module (other than the largest size), with the fastener 40 being installed at a different pair of the holes 28/29 depending on the size of the module being used. If the largest M.2 module is used, the fastener 40 is omitted, and instead of attaching the module to the clip 20, the module is attached directly to the PCA using the M.2 mount thereof.

The first and second portions 41 and 42 of the adapter fastener 40 may also be connected with one another. For example, the second portion 42 may include a coupling portion which extends beyond the engagement portion and couples with the first portion 41 when both are installed in corresponding holes 28/29. For example, the coupling portion may comprise a pin or column which extends through the semi-circular hole of the M.2 mount and enters a bore in the first portion 41 to couple the first and second portion 41 and 42 together.

As noted above, the M.2 adapter/heatsink 10 also comprises the spacer 30. The spacer 30 is configured to be attached to heat spreader clip 20 near the distal end thereof when an M.2 module other than the longest M.2 module is installed in the clip 20. (The proximal end of the M.2 module is the end with the edge connector, and similarly the proximal end of the adapter/heatsink 10 is the end that is adjacent the edge connector of the M.2 module; the distal ends thereof are the ends opposite from the proximal ends thereof.) The spacer 30 is disposed in the space between the top wall 21 and the bottom wall 22, adjacent to and in line with the M.2 module. The spacer 30 may be attached to the top wall 21 and/or the bottom wall 22, for example via a screw or other fastener. The spacer 30 comprises a replica M.2 mount 35 formed therein. The replica M.2 mount 35 has a similar shape and dimensions as a standard M.2 mount, but is referred to herein as a "replica" because it is formed on the spacer 30 and not on an actual M.2 module. The spacer 30 is positioned in the clip 20 such that the replica M.2 mount 35 is at the same position as the M.2 mount of the largest M.2 module when the largest M.2 module is installed in the clip 20. Thus, the replica M.2 mount 35 is aligned with the same PCA fastener that would be used to fasten the largest M.2 module to the PCA. The spacer 30 can thus be attached to the PCA using that M.2 fastener, thereby attaching the M.2 adapter/heatsink 10 to the PCA.

For example, FIG. 2 illustrates an example assembly 85 comprising the M.2 adapter/heatsink 10 with an M.2 module 50 installed therein, and an example system 90 comprising the assembly 85 and a host PCA 60. The M.2 module 50 has a size that is in the set of compatible sizes for the M.2 adapter/heatsink, but is not the longest M.2 module in the set. The M.2 module 50 is disposed in the space between the top and bottom walls 21 and 22, and the M.2 module 50 is thermally coupled to the top wall 21 and the bottom wall 22, as indicated by the dotted lines in FIG. 2. The adapter fastener 40 is then installed at a pair of fastener holes 28/29 which correspond to the particular size of the M.2 module 50, and therefore the first and second portions 41 and 42 of the fastener 40 are engaged with opposite sides of the M.2 mount 52 of the M.2 module 50, as indicated by dashed lines in FIG. 2. In addition, the spacer 30 is installed in and attached to the adapter/heatsink 10, as indicated by dashed lines in FIG. 2. The resultant combination of the M.2 adapter/heatsink 10 with the M.2 module 50 installed therein forms the assembly 85.

The assembly 85 may then be positioned adjacent a host PCA 60, and a connector 51 of the M.2 module 50 may be physically and electrically connected to a complementary connector 61 of the PCA 60. The distal end of the assembly 85 is then secured to the PCA 60 by a PCA fastener 65 which is engaged with the replica M.2 mount 35 of the spacer 30 at one end and with a fastener hole 66 coupled to the PCA 60 at the other end. The PCA fastener 65 may be standoff with set screw, such as would ordinarily be used to fasten a bare M.2 module to the PCA 60. Thus, one end of the assembly 85 is coupled to the PCA 60 by the engagement between connectors 51 and 61, while the opposite end of the assembly 85 is connected to the PCA 60 via spacer 30 and PCA fastener 65.

As noted above, the M.2 module 50 is not the longest module in the set of compatible modules. Thus, the heat spreader clip 20 extends beyond the distal end of the M.2 module 50 and blocks the M.2 mount 52 thereof from being connected directly to the PCA 60. Nevertheless the M.2 module 50 can be securely attached to and supported by the PCA 60. This is made possible by virtue of the adapter fastener 40 attaching the M.2 module 50 to the clip 20 and the spacer 30 attaching the clip 20 to the PCA 60. Moreover, even if a differently sized M.2 module (other than the longest M.2 module) were used in the place of the M.2 module 50, the same results could be achieved, with the only difference being that the adapter fastener 40 would be installed at a different pair of holes 28/29 corresponding to the size of the other M.2 module. If the longest M.2 module is used instead, then the spacer 30 and adapter fastener 40 are omitted and the PCA fastener 65 is connected directly to the M.2 mount 52 of the M.2 module.

In some examples, the PCA 60 comprises a primary system board (e.g., motherboard) of a computing system, and the M.2 module 50 is electrically connected to processing circuitry on the PCA 60 via the connectors 51 and 61.

In other examples, the PCA 60 may comprise a riser card, which is a circuit board that serves as an intermediary that facilitates connection between the M.2 module 50 and a primary system board. In such cases, the PCA 60 may comprise an additional connector 62 to electrically connect the PCA 60 to the primary system board. The connector 62 may be electrically connected to connector 61 via internal circuitry of the PCA 60, so that the M.2 module 50 is connected to the processing circuitry of the primary system board via a communication path extending through the connector 51, the connector 61, and the connector 62.

Turning now to FIGS. 3-23, another example M.2 adapter/heatsink 110 and two example assemblies 185 and 285 comprising the M.2 adapter/heatsink 110 will be described. The M.2 adapter/heatsink 110 is one example configuration of the M.2 adapter/heatsink 10. Thus, some components of the M.2 adapter/heatsink 110 correspond to (i.e., are the same as, similar to, and/or example configurations of) components of the M.2 adapter/heatsink 10 described above. The components of the M.2 adapter/heatsink 110 and the components of the M.2 adapter/heatsink 10 which correspond to one another are given reference numbers with the same last two digits, such as 20 and 120. The descriptions above of the components of the M.2 adapter/heatsink 10 are applicable to the corresponding components of the M.2 adapter/heatsink 110 (unless otherwise indicated or logically contradictory), and thus duplicative descriptions of some aspects already described above are omitted below.

FIGS. 3-23 show the M.2 adapter/heatsink 110 in various perspectives and in various states, and aspects of the M.2 adapter/heatsink 110 in may be visible in multiple of the figures. The description below will refer to the figures as and when they are relevant to the aspect being described, rather than in strict numerical order.

As shown in FIGS. 3-10, the M.2 adapter/heatsink 110 comprises a heat spreader clip 120. The heat spreader clip 120 comprises a top wall 121, a bottom wall 122, and a spine 123. The top wall 121, bottom wall 122, and spine 123 are integrally connected. For example, in some implementations the top wall 121, bottom wall 122, and spine 123 are formed from a single piece of sheet metal which has been bent and/or otherwise formed into the shape of the heat spreader clip 120. The top wall 121 and bottom wall 122 are arranged substantially parallel to one another, extending parallel to the x-y plane in FIGS. 3-23. The spine 123 is perpendicular to the top and bottom walls 121 and 122, extending parallel to the y-z plane in FIGS. 3-23. The spine 123 extends between the top wall 121 and the bottom wall 122, with the spine 123 being attached to the top and bottom walls 121 and 122 at lateral edges thereof. Thus, the heat spreader clip 120 has a generally C- or U-shaped cross-section. The attached edges of the top and bottom walls 121 and 122 are the lateral edges thereof which extend parallel to a longitudinal (lengthwise) dimension of the heat spreader clip 120, i.e., parallel to the y-axis as illustrated in the figures. The longitudinal dimension of the heat spreader clip 120 corresponds to the longitudinal dimensions of the M.2 modules when installed in the M.2 adapter/heatsink 110.

Figures 3, 4:
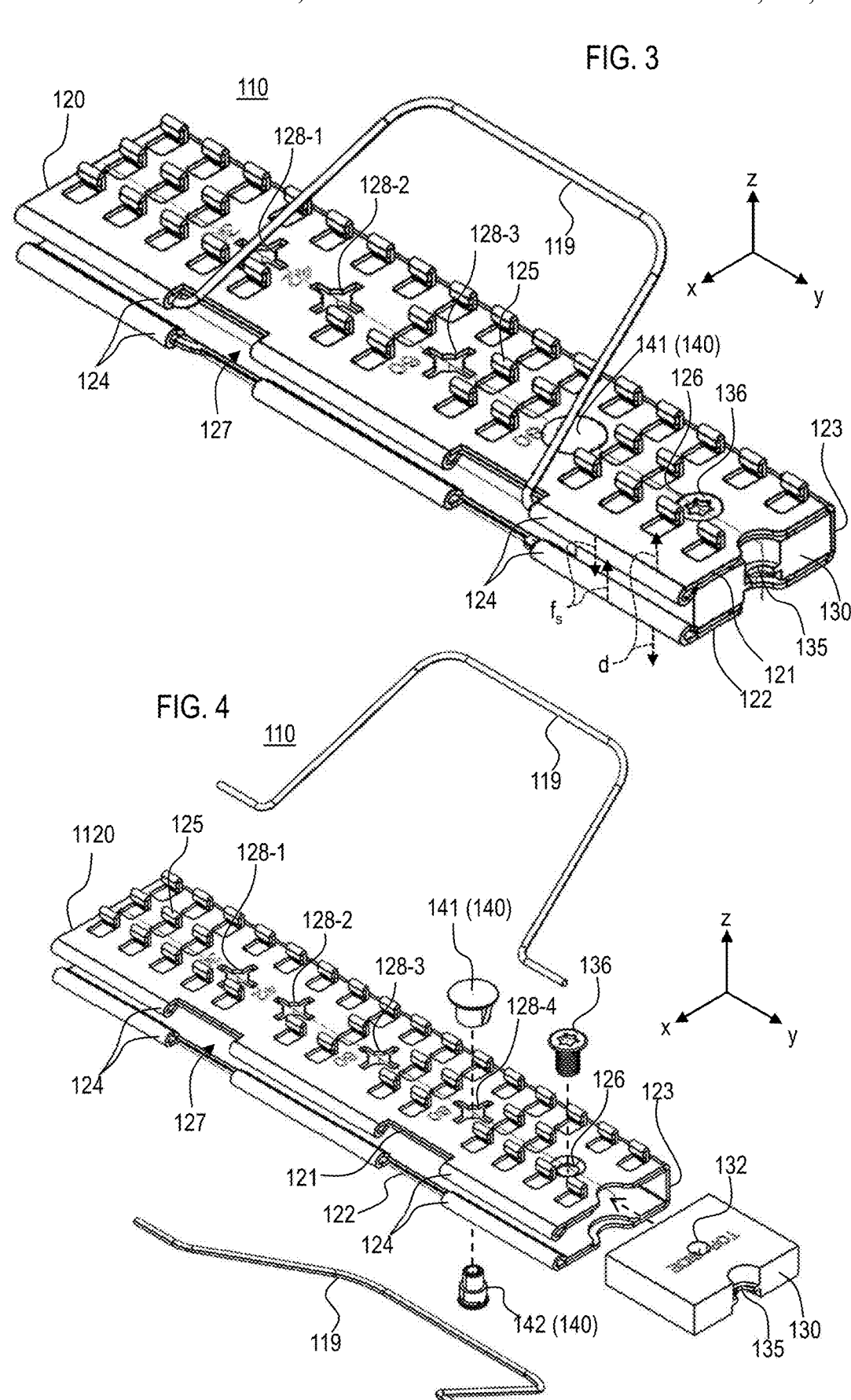
FIG. 3 is a perspective view of another example M.2 adapter/heatsink.
FIG. 4 is an exploded perspective view of the M.2 adapter/heatsink of FIG. 3.
Figures 5, 6, 7, 8, 9, 10:
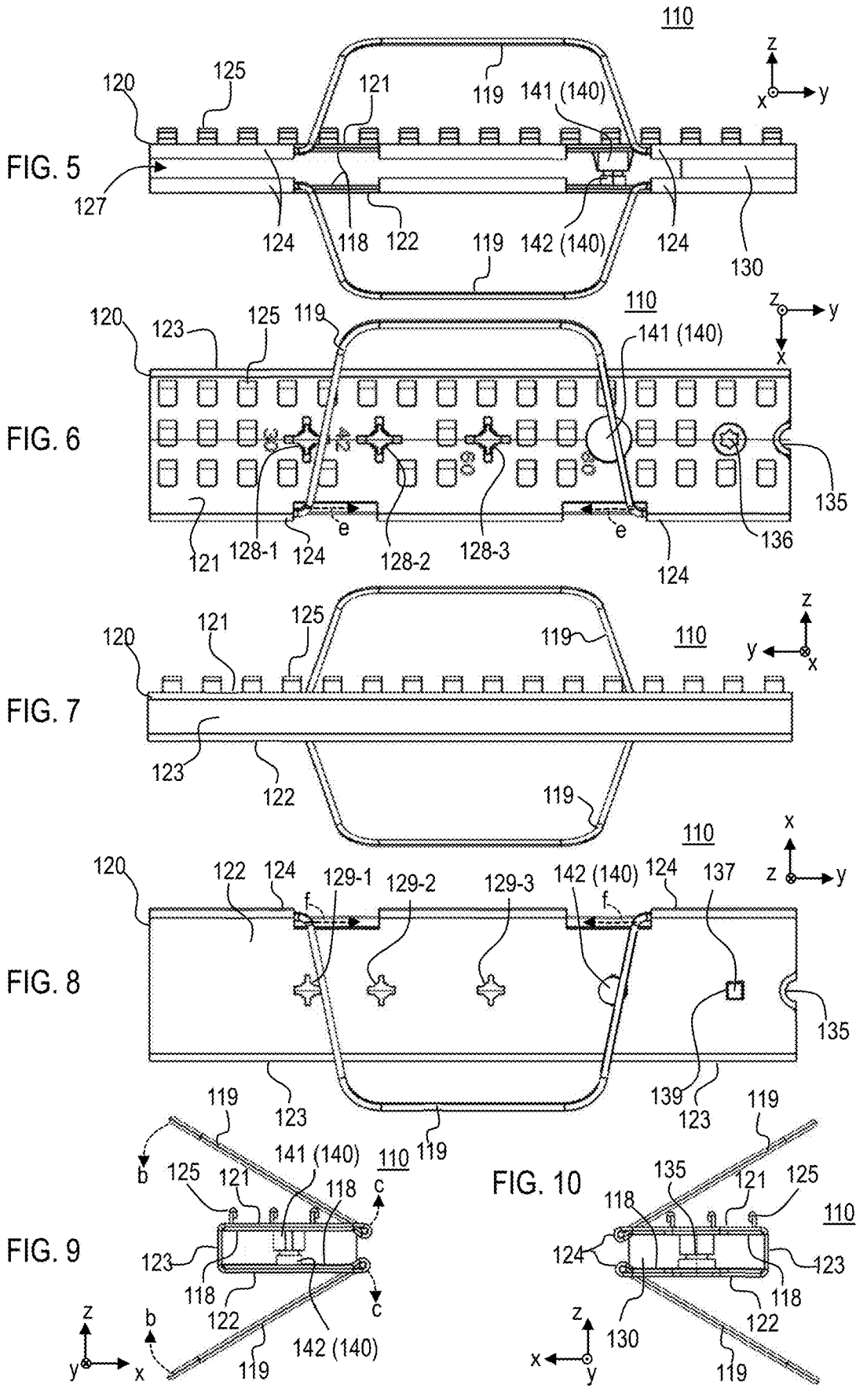
FIG. 5 is a front view of the M.2 adapter/heatsink of FIG. 3.
FIG. 6 is a top view of the M.2 adapter/heatsink of FIG. 3.
FIG. 7 is a rear view of the M.2 adapter/heatsink of FIG. 3.
FIG. 8 is a bottom view of the M.2 adapter/heatsink of FIG. 3.
FIG. 9 is a left side view of the M.2 adapter/heatsink of FIG. 3.
FIG. 10 is a right side view of the M.2 adapter/heatsink of FIG. 3.
Figure 15:
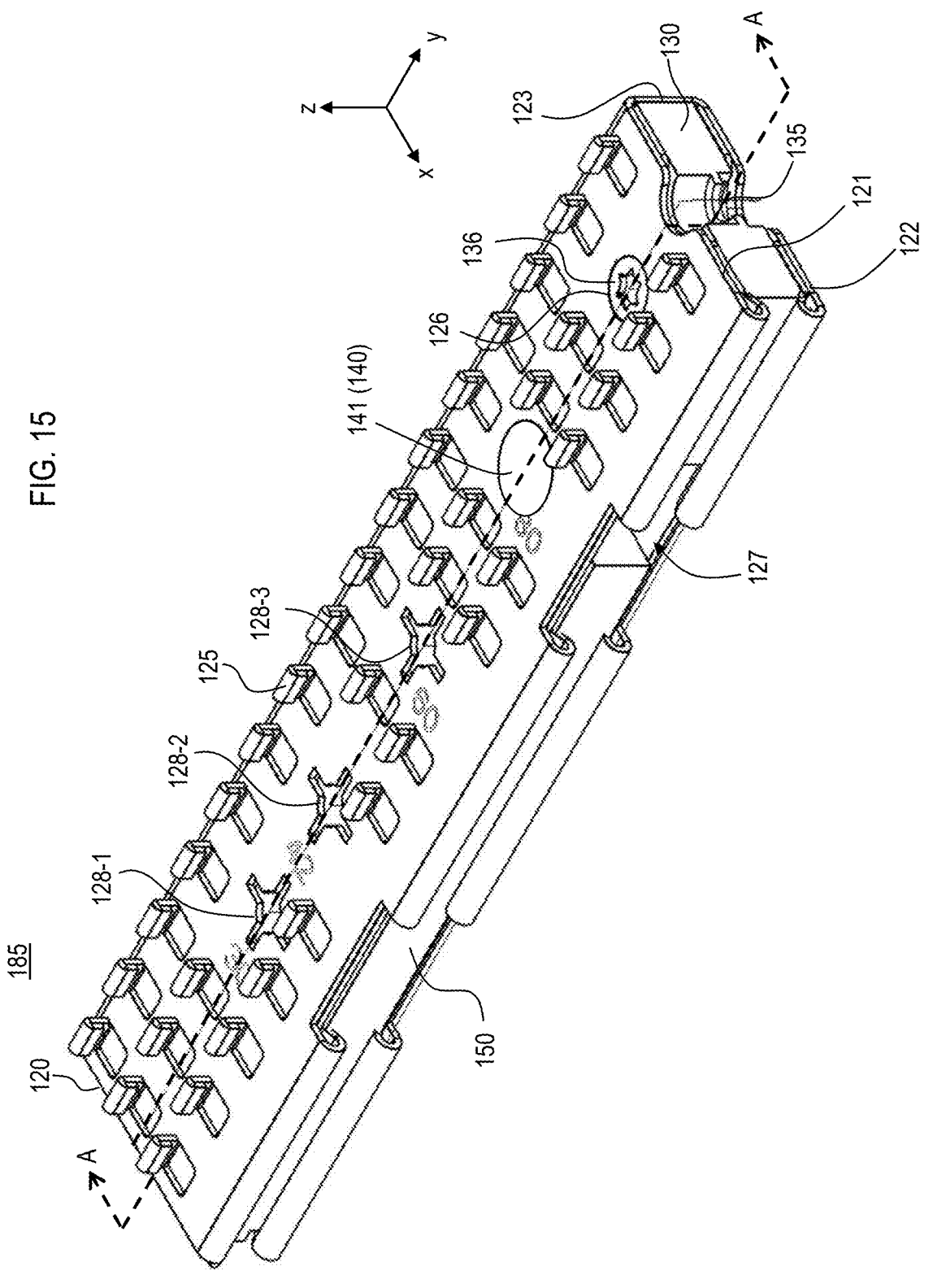
FIG. 15 is a perspective view of the M.2 adapter/heatsink of FIG. 3 with a first M.2 module installed therein.
Figure 22:
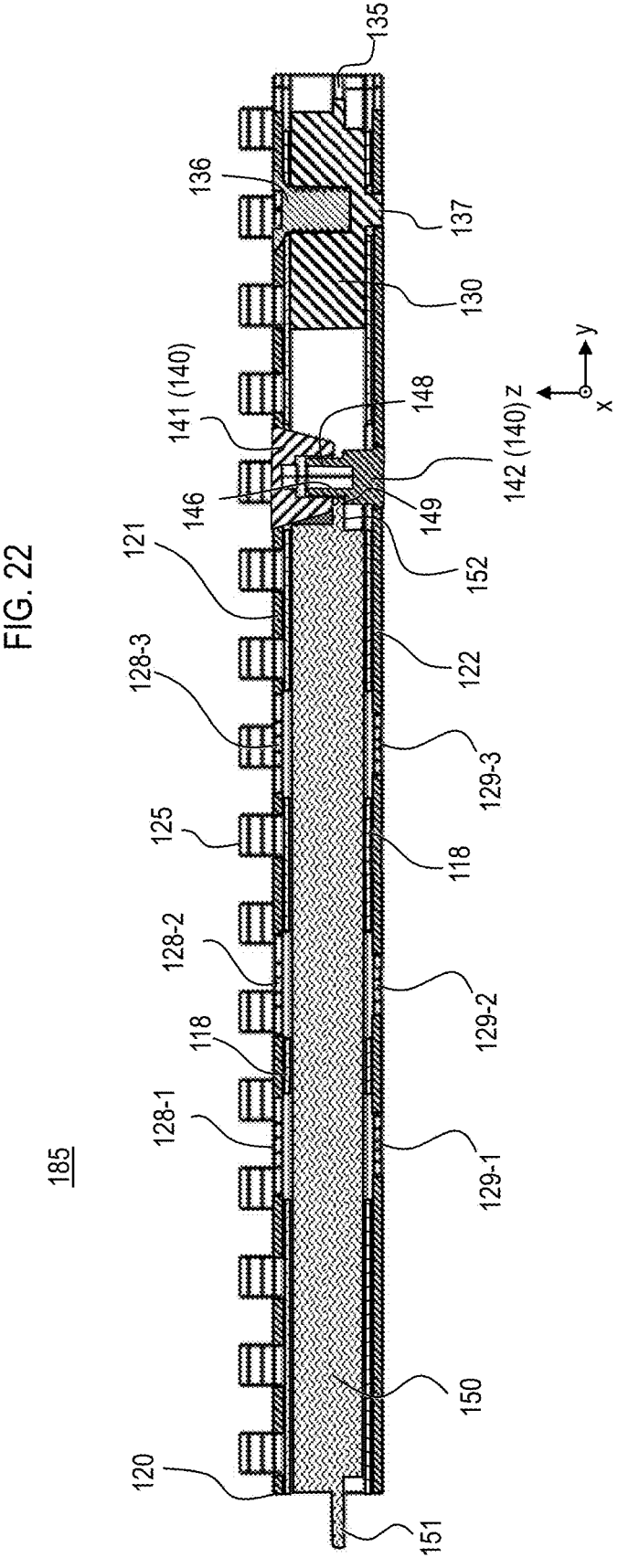
FIG. 22 is a cross-section of the M.2 adapter/heatsink and the first M.2 module of FIG. 15 with section taken along A-A.
Figure 23:
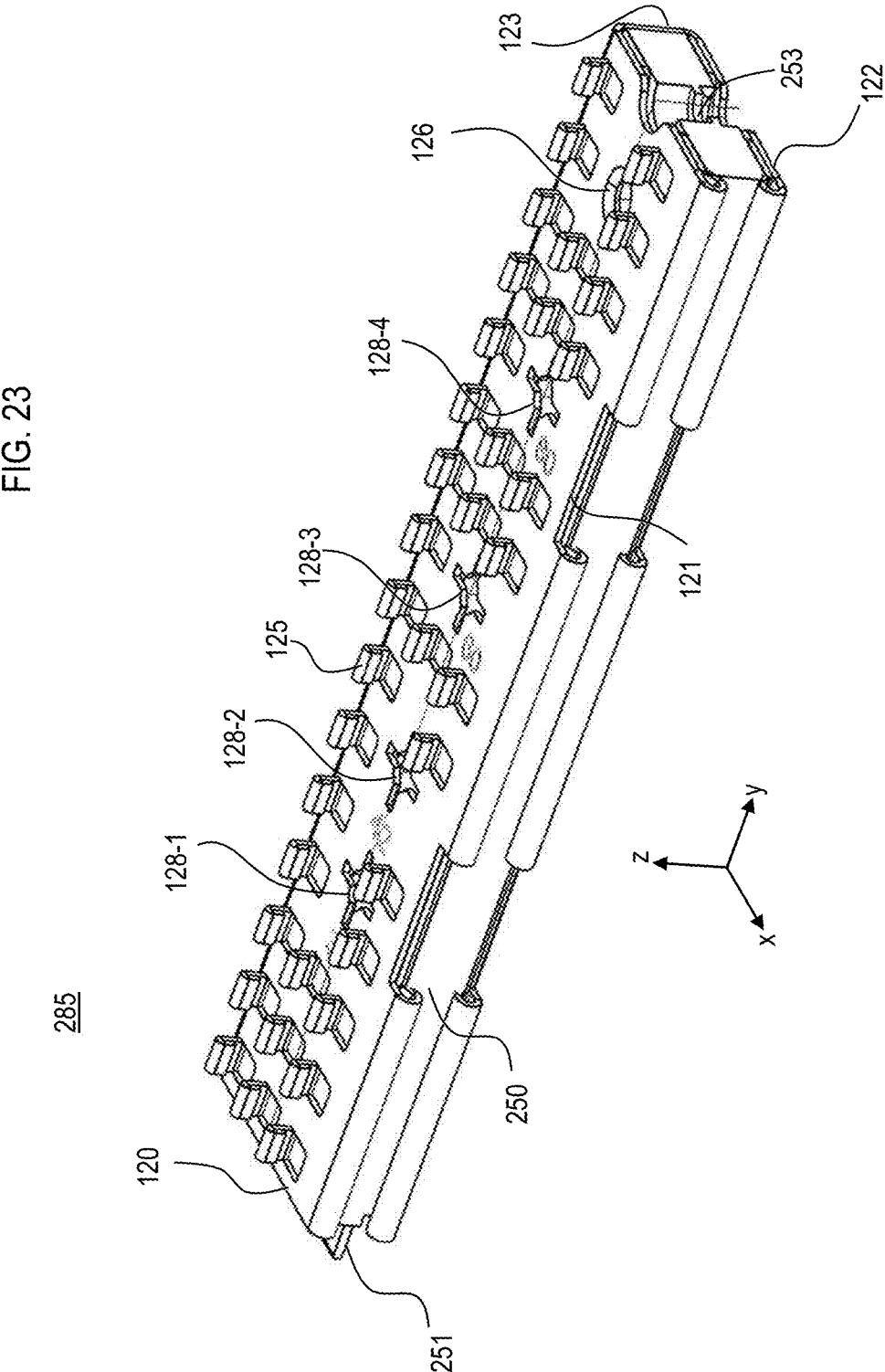
FIG. 23 is a perspective view of the M.2 adapter/heatsink of FIG. 3 with a second M.2 module installed therein.

As shown in FIGS. 3-5, a space 127 is defined between the top and bottom walls 121 and 122, and this space 127 is configured to receive an M.2 module. When an M.2 module is installed in the clip 120, the two broadest faces of the M.2 module abut the top and bottom walls 121 and 122 respectively, as illustrated in FIG. 22 with respect to the M.2 module 150. For example, FIGS. 15 and 23 illustrate two example M.2 modules 150 and 250 installed in the space 127 in the clip 120. In particular, the M.2 adapter/heatsink 110 is configured to be usable with multiple sizes of M.2 modules, which may be referred to as a set of compatible M.2 modules. In some examples, this set includes at least M.2 modules having lengths of 30, 42, 60, 80, and 110 mm. For example, the M.2 module 250 illustrated in FIG. 23 is a 110 mm in length, whereas the M.2 module 150 illustrate din FIG. 15 is 80 mm in length. Other M.2 modules (not illustrated), such as 30, 42, 60 mm modules may also be used with the M.2 adapter/heatsink 110.

The heat spreader clip 120 is formed from thermally conductive materials. In some examples, the heat spreader clip 120 is formed from copper (or an alloy thereof), aluminum (or an alloy thereof), brass (or an alloy thereof), nickel (or an alloy thereof), zinc (or an alloy thereof), stainless steel, another thermally conductive metal (or an alloy thereof), or a thermally conductive plastic. In some examples, the heat spreader clip 120 is formed from a highly thermally conductive material (defined below), such as certain forms of copper or aluminum.

The heat spreader clip 120 is configured to thermally couple with the M.2 modules when the modules are installed in the heat spreader clip 120. Specifically, the heat spreader clip 120 is configured such that each of the top and bottom walls 121 and 122 is either: (1) in direct contact with the M.2 modules installed in the clip 120, or (2) indirectly in contact with the M.2 modules via mutual contact with the TIM 118, which is disposed between respective wall and the M.2 module. In some examples, as shown in FIGS. 5, 9, 10, a TIM 118 is attached to the bottom side of the top wall 121 and similarly another TIM 118 is attached to the top side of the bottom wall 122. The TIM 118 may be, for example, a thermal gap pad, at thermal grease, a thermal paste, or any other TIM. When the M.2 module is installed in the clip 120, the two TIM 118 layers are disposed between the M.2 module and the top and bottom walls 121 and 122, as shown in FIGS. 16 and 20-22. In other examples, the TIM 118 is omitted.

The heat spreader clip 120 is configured to act like a spring clip which generates spring forces that clamps the top and bottom walls 121 and 122 against opposite faces of the M.2 module (directly, or via TIM 118). More specifically, the top and bottom walls 121 are spring biased towards a resting position in which free edges of the top and bottom walls 121 and 122 (i.e., the edges opposite from the attached edges which are attached to the spine 123) are a first distance apart. If the top and bottom walls 121 and 122 are deflected away from this resting position along directions "d" illustrated in FIG. 3, such that the free edges of the top and bottom walls 121 and 122 are farther than the first distance apart, then spring forces $f_s$ are generated which oppose the displacement and urge the top and bottom walls 121 and 122 in the opposite direction (i.e., back toward the resting position), as indicated by the arrows labeled $f_s$ in FIG. 3. Such displacement of the walls 121 and 122 may occur when the M.2 module is installed, and in such a case the resulting spring force $f_s$ presses the top and bottom walls 121 against the opposite faces of the M.2 module. This clamping action may help to ensure good thermal contact between the clip 120 and the M.2 module, whether that be direct contact or indirect contact via a TIM 118. This thermal coupling of the heat spreader clip 120 to the M.2 module allows the heat spreader clip 120 to absorb heat from heat generating components of the M.2 modules and dissipate the heat into surrounding air.

As shown in FIGS. 3-6, 9 and 10, the heat spreader clip 120 also comprises protrusions 125, which are attached to the top wall 121. These protrusions 125 protrude from the face of the top wall 121 to facilitate better heat transfer into the surrounding air. These protrusions 125 comprise folded fins which are integrally coupled to the top wall 121. For example, in some implementations the top wall 121 comprise planar pieces of sheet metal and the protrusions 125 comprise folded fins which are stamped from the sheet metal. As shown in FIGS. 3, 9 and 10, in some examples the protrusions 125 are rounded over (folded over) at the distal ends thereof to avoid having sharp edges protruding out where they may injure someone.

As shown in FIGS. 3-10, the adapter/heatsink 110 comprises removable metal wire handles 119. These wire handles 119 may be attached to the heat spreader clip 120 during installation of the M.2 module and then may be removed thereafter. In particular, the top and bottom walls 121 and 122 comprise handle receptacles 124 which receive the ends of the wire handles 119, as shown in FIGS. 3 and 4. The wire handles 119 are actuatable by a user to spread apart the top and bottom walls 121 and 122, thus allowing the M.2 module to be inserted into the space 127 between the top and bottom walls 121 and 122. In particular, as shown in FIG. 9, the handles 119 act as levers which use the top and bottom walls 121 and 122 as fulcrums such that squeezing the free ends of the handles 119 together along the directions labeled "b" in FIG. 9 forces the free edges of the top and bottom walls 121 and 122 to move away from one another along the directions labeled "c" in FIG. 9. After the M.2 module is inserted into the clip 120, the handles 119 may be released, which allows the spring force $f_s$ to move the top and bottom walls 121 and 122 back in the opposite direction to press against the M.2 module. The handles 119 may be removed from the clip 120 by pulling the ends of the handles 119 along the directions "e" and "f" illustrated in FIGS. 6 and 8, resulting in the ends of the handles 119 coming out of the receptacles 124.

As described above, when the M.2 adapter/heatsink 110 is used and any of the sizes of M.2 modules is installed therein other than the largest size, the M.2 module is not coupled directly to the PCA. Instead, the M.2 module is coupled to the heat spreader clip 120 via an adapter fastener 140 which engages with fastener holes 128/29 in the clip 120, and then the adapter/heatsink 110 is attached to the PCA via a spacer 130. Thus, the M.2 modules are indirectly coupled to the PCA via the M.2 adapter/heatsink 110. If the largest M.2 module is used, then the fastener 140 and the spacer 130 are omitted and the M.2 module can be coupled directly to the PCA.

As shown in FIGS. 3, 4, and 6, the top wall 121 comprises a plurality of fastener holes 128, namely fastener holes 128-1, 128-2, 128-3, and 128-4. Similarly, the bottom wall 122 comprises a plurality of fastener holes 129, namely fastener holes 129-1, 129-2, 129-3, and 129-4. The plurality of fastener holes 128 are distributed along a length dimension of the top wall 121 (parallel to y-axis), and the plurality of fastener holes 129 are distributed along a length dimension of the bottom wall 122 (parallel to y-axis), with each fastener hole 128 being aligned with a corresponding fastener hole 129 to form a pair. Each pair of fastener holes 128/29 corresponds to one of the M.2 sizes of the set of compatible M.2 sizes and is positioned so as to align with the M.2 mount of the corresponding M.2 module when the module is installed in the clip 120. In particular, the fastener holes 128-1 and 129-1 correspond to a first size of M.2 module (e.g., 30 mm), the fastener holes 128-2 and 129-2 correspond to a second size of M.2 module (e.g., 42 mm), the fastener holes 128-3 and 129-3 correspond to a third size of M.2 module (e.g., 60 mm), and the fastener holes 128-4 and 129-4 correspond to a fourth size of M.2 module (e.g., 80 mm). A fifth size of M.2 module (e.g., 110 mm) may also be part of the set of compatible M.2 modules, but there are no fastener holes 128/129 for this largest M.2 module because it is able to connect directly to the PCA, as will be described below.

Figure 11:
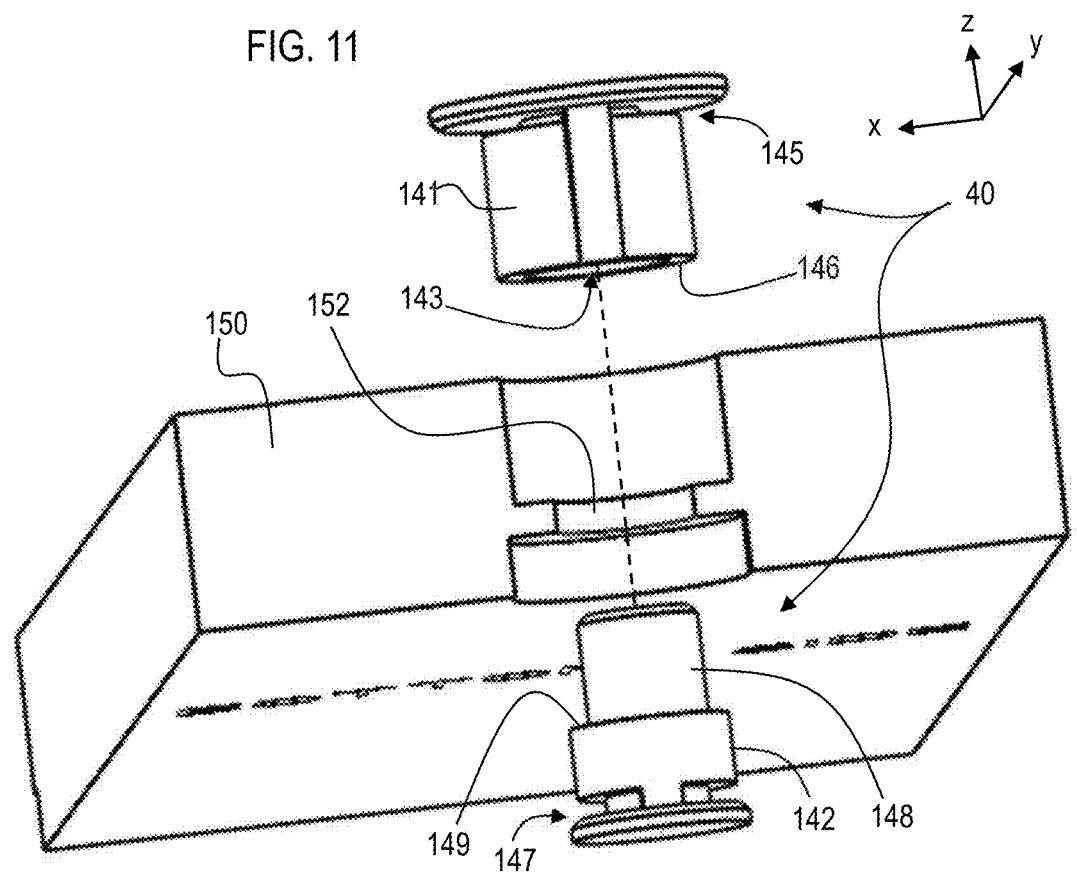
FIG. 11 is a perspective view of an M.2 fastener of the M.2 adapter/heatsink of FIG. 3 and an M.2 module in a detached state.
Figure 12:
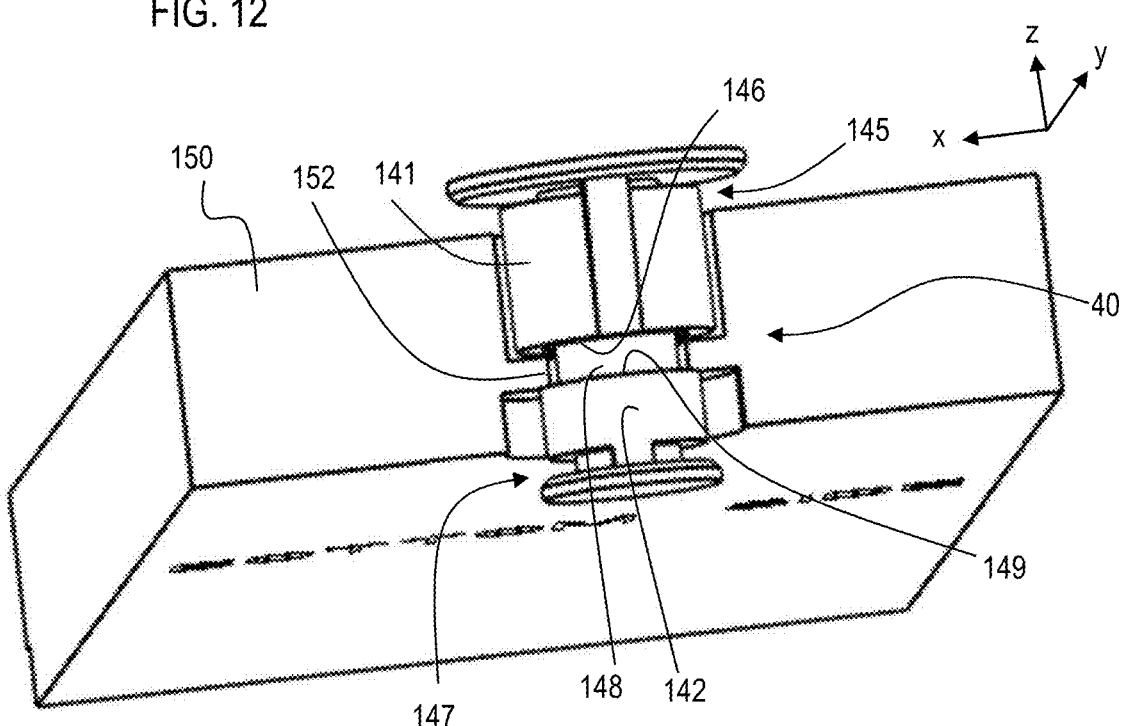
FIG. 12 is a perspective view of the M.2 fastener and the M.2 module of FIG. 11 in an attached state.

The adapter fastener 140 is configured to be selectively installable at any one of the pairs of fastener holes 128/129. As shown in FIGS. 4, 11, and 12, the adapter fastener 40 comprises a first portion 141 and a second portion 142. As shown in FIGS. 4 and 22, when the adapter fastener 140 is installed at a given pair of fastener holes 128/129, the first portion 141 engages with the fastener hole 128 in the top wall 121 and the second portion 142 engages with the fastener hole 129 of the bottom wall 122. In this manner the adapter fastener 140 is attached to the heat spreader clip 120.

For example, as shown in FIGS. 11 and 12, the first portion 141 comprises a columnar standoff with snap-fit features 145 disposed at one end thereof. The snap fit features 145 include grooves/recesses around the circumference of the first portion 141 into which the rim of the hole 128 may be received as the first portion 141 is pressed into the holes 128. For example, the first portion 141 is slightly oversized for the hole 128 and thus it is compressed as it is pressed into the hole 128 and/or the rim of the hole 128 bends and expands as the first portion 141 is pressed into it (cuts may be present in the rim of the hole 128 to facilitate such bending/expansion). Whether the first portion 141 is compressed of the rim is expanded (or both), in either case when the recess of the snap fit feature 145 reaches the rim of the hole 128, the rim of the hole 128 "snaps" into the recess allowing the parts elastically bounce back to their normal size and position. The rim of the hole 128 is thereafter retained in the recess, thereby attaching the first portion 141 to the top wall 121. The snap fit features 145 may also comprise a cap at the end of the first portion 141 to abut the top side of the top wall 121 and prevent the first portion 141 from being pressed all the way through the hole 128. The second portion 142 comprises similar snap-fit features 147, which may be different is size and/or configuration but similar in function to the snap-fit features 145. Thus, the first portion 141 of the adapter fastener 140 may be positioned above the top wall 121 and then the first portion 141 is pressed downward (−z direction) into the fastener hole 128, causing the first portion 141 to extend into the interior space 127 between the top and bottom walls 121 and 122 and causing the snap-fit features 145 of the first portion 141 to engage with the fastener hole 128. Conversely, the second portion 142, may be positioned below the bottom wall 122 and then the second portion 142 is pressed upward (+z direction) into the fastener hole 129, causing the second portion 142 to extend into the interior space 127 between the top and bottom walls 121 and 122 and causing the snap-fit features of the second portion 142 to engage with the fastener hole 129. FIGS. 5, 6, 8, and 9 illustrate the first portions 141 and 142 installed in the holes 128-4 and 129-4, without an M.2 module present.

As shown in FIGS. 11 and 12, the first and second portions 141 and 142 of the adapter fastener 140 also comprise engagement surfaces 146 and 149, respectively. The engagement surface 146 comprises an end face of the first portion 141 opposite from the snap fit features 145. The engagement surface 149 comprises a ledge (shoulder) that circumferentially surrounds the second portion 142 and is positioned between the snap fit features 145 and the opposite end of the second portion 142. The engagement surfaces 146 and 149 are configured to engage opposite sides of an M.2 mount of an M.2 module in a state of the M.2 module being installed in the clip 120 and the adapter fastener 140 attached to the clip 120. For example, as shown in FIGS. 11 and 12, if a given M.2 module 150 is installed in the clip 120 (clip 120 is omitted in FIGS. 11 and 12 to allow better visibility), then as the first portion 141 is inserted into the corresponding fastener hole 128-4, the engagement surface 146 of the first portion 141 engages (e.g., contacts or abuts) the top surface of the M.2 mount 152 of the given M.2 module 150. Then as the second portion 142 is inserted into the corresponding fastener hole 129-4, the engagement surface 149 of the second portion 142 engages (e.g., contacts or abuts) the bottom surface of the M.2 mount 152 of the given M.2 module 150. Thus, as shown in FIG. 12, the M.2 mount 152 is clamped between the first and second portions 141 and 142, thereby fastening the M.2 module 150 to the adapter fastener 140. Thus, the M.2 module is attached to the clip 120 by way of its engagement with the fastener 140. See also FIGS. 16 and 22, which illustrates the first and second portions 141 and 142 in the installed state attached to the M.2 mount 152. Although the example described above relates to the M.2 module 150, it should be understood that other sizes of M.2 modules could be used and the attachment sequence would be similar, except that a different pair of the holes 128/129 would be used based on the size of the M.2 module (unless the M.2 module is the largest module, in which case the fastener 40 is omitted).

The first and second portions 141 and 142 of the adapter fastener 140 are also configured to be connected with one another when installed at a pair of holes 128/129. For example, as shown in FIG. 11, the second portion 142 includes a coupling portion 148 which protrudes beyond the engagement surface 149. As shown in FIGS. 12 and 22, this coupling portion 148 is configured to be received within an interior bore 143 of the first portion 141 when both are installed in a pair of holes 128/129, thus coupling the second portion to the first portion 141. The coupling portion 148 extends through the semi-circular hole of the M.2 mount 152.

As shown in FIG. 4, the M.2 adapter/heatsink 110 also comprises the spacer 130. As shown in FIGS. 3 and 4, the spacer 130 is configured to be attached to heat spreader clip 120 near the distal end thereof when an M.2 module other than the longest M.2 module is installed in the clip 120. The spacer 130 is disposed in the space 127 between the top wall 121 and the bottom wall 122, adjacent to and in line with the M.2 module. As shown in FIGS. 3, 4, 13, and 22, the spacer 130 is attachable to the top wall 121 by a screw 136 which extends through screw hole 126 in the top wall 121 and engages with a threaded hole 132 in the top of the spacer 130. As shown in FIGS. 8, 14, and 22, the spacer 130 is engaged with the bottom wall 122 by a locating feature 137, which extends into an aperture 139 in the bottom wall 122.

Figure 13:
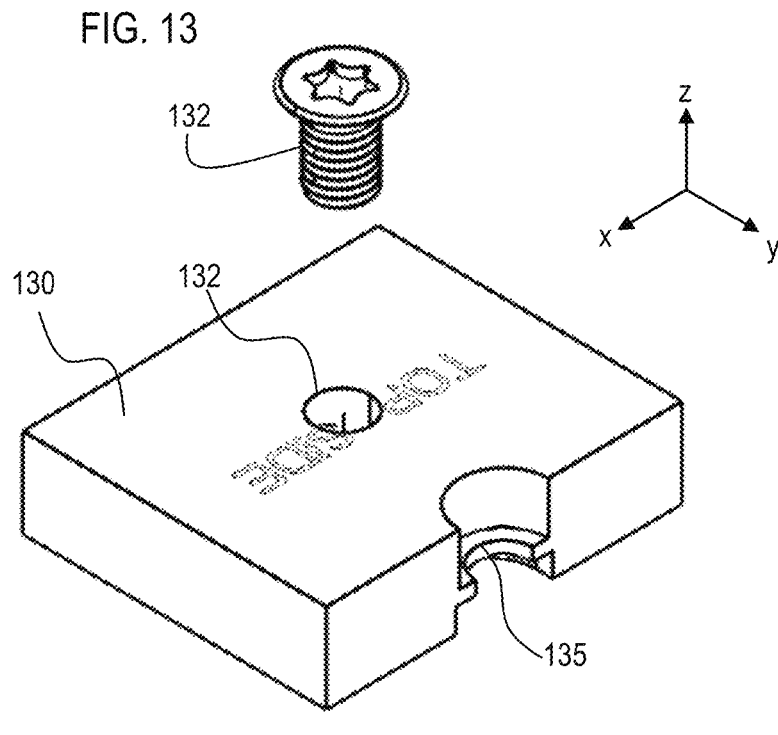
FIG. 13 is a top perspective view of a spacer of the M.2 adapter/heatsink of FIG. 3.
Figure 14:
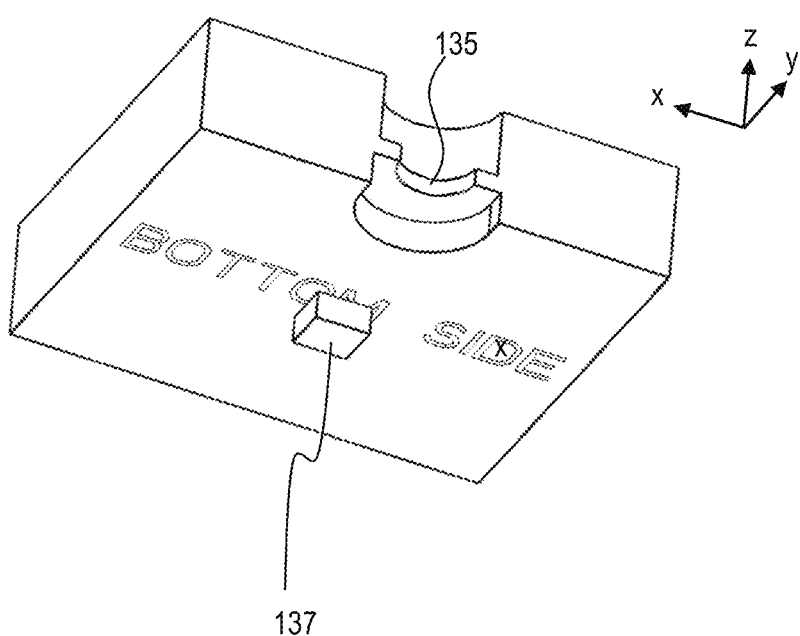
FIG. 14 is a bottom perspective view of a spacer of the M.2 adapter/heatsink of FIG. 3.

As shown in FIGS. 13 and 14, the spacer 130 comprises a replica M.2 mount 135 formed therein. The replica M.2 mount 135 has a similar shape and dimensions as a standard M.2 mount, but is referred to herein as a "replica" because it is formed on the spacer 130 and not on an actual M.2 module. When installed, the spacer 130 is positioned in the clip 120 such that the replica M.2 mount 135 is at the same position as the M.2 mount 253 of the largest M.2 module 250 when the largest M.2 module 250 is installed in the clip 120.

For example, FIG. 23 illustrates an assembly 285 comprising the largest M.2 module 250 installed in the clip 120, while FIG. 15 illustrates an assembly 185 comprising a smaller M.2 module 150 and spacer 130 installed in the clip 120 (see also FIGS. 16-22 for additional views of the assembly 185). As can be seen by comparing FIGS. 15 and 23, the location of the replica M.2 mount 135 in FIG. 15 is the same as the location of the M.2 mount 253 in FIG. 23. Thus, the replica M.2 mount 135 can be fastened to the PCA using the same PCA fastener that would be used to fasten the M.2 mount 235 to the PCA. Note that in the assembly 185 the fastener 140 and the spacer 130 are omitted.

Figures 24, 25, 26:
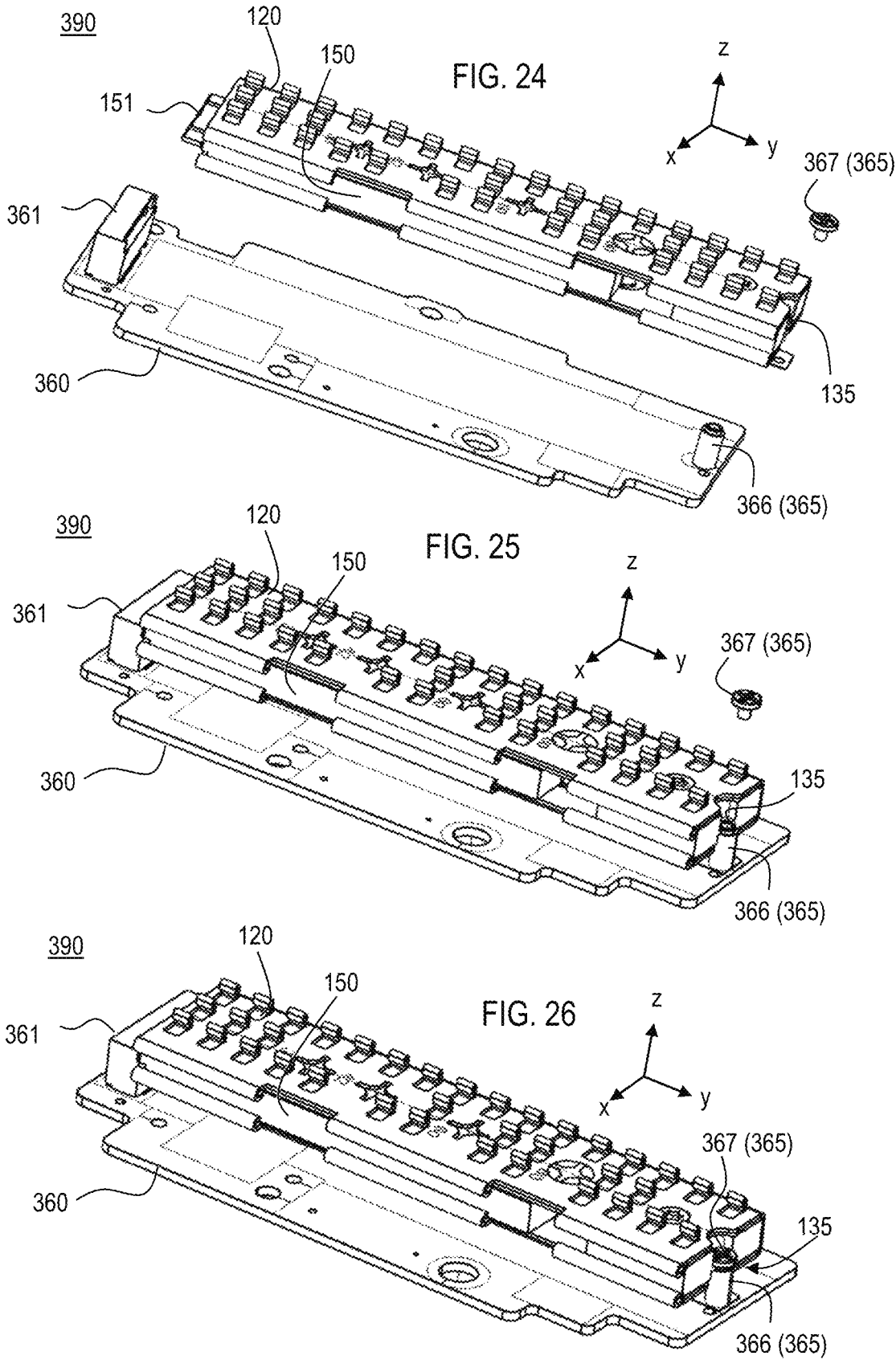
FIG. 24 is a perspective view of an example system in a first state, the system comprising a PCA and the M.2 adapter/heatsink of FIG. 3 with the first M.2 module installed therein.
FIG. 25 is a perspective view of the system of FIG. 23 in a second state.
FIG. 26 is a perspective view of the system of FIG. 23 in a third state.

Turning now to FIGS. 24-28, an example system 390 is described. The system 390 comprises a PCA 360 and an assembly comprising the M.2 adapter/heatsink 110 and an M.2 module installed therein. The assembly 185 comprising the M.2 adapter/heatsink 110 with the M.2 module 150 installed therein is shown in FIGS. 24-26 as an illustrative example, but any of the M.2 modules described herein may be used in the M.2 adapter/heatsink 110 in the system 390. The PCA 360 may be any PCA, including a primary system board of a computing device, a riser card, or some other PCA. Only a portion of the PCA 360 is illustrated in FIGS. 24-26.

Figure 27:
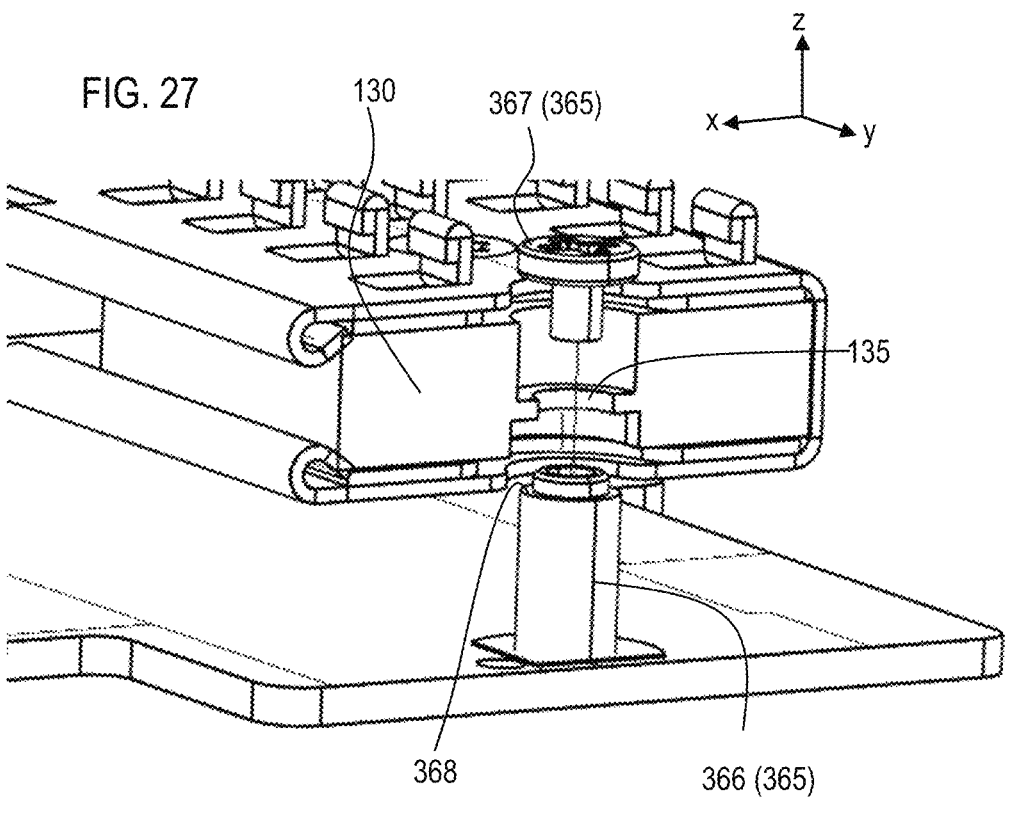
FIG. 27 is a partial perspective view of a portion of the system of FIG. 23 in the first state.

FIG. 24 illustrates an initial state in a sequence of events for attaching the assembly 185 to the PCA 360. The assembly 185 is brought adjacent to the PCA 360 and a screw 367 of a PCA fastener 365 is removed from a standoff 366 of the PCA fastener 365. The standoff 366 of the PCA fastener 365 is attached to the PCA 360 at a predetermined position which is set such that the standoff 366 would be aligned with the M.2 mount 235 of the long M.2 module 250 if the electrical connector 251 of the long M.2 module 250 were connected to the electrical connector 361. FIG. 27 illustrates the standoff 366 and screw 367 of the PCA fastener 365 in greater detail.

As shown in FIG. 25, the next operation in installing the assembly 185 is connecting the edge-style electrical connector 151 of the M.2 module 150 with the complementary electrical connector 361 of the PCA 360. This results in the replica M.2 mount 135 of the spacer 130 being aligned with the standoff 366, and a bottom surface of the replica M.2 mount 135 may rest on an engagement surface 368 of the standoff 366 (see FIG. 27 for a view of the engagement surface 368). The replica M.2 mount 135 of the spacer 130 is aligned with the standoff 366 because the standoff 366 is positioned to mate with the M.2 mount 235 of the longer M.2 module 250 and, as noted above, the replica M.2 mount 135 is positioned at the same location relative to the clip 120 as the M.2 mount 235 would be if the module 250 were installed in the clip 120 instead. FIG. 27 illustrates replica M.2 mount 135 in a state just after the electrical connectors 151 and 361 have been connected, but with the M.2 mount 135 raised slightly up off the standoff 366 to allow for better visibility of the engagement surface 368 (in practice, the replica M.2 mount 135 may be resting upon the engagement surface 368 in this state). As can be seen in FIG. 27, in this state the engagement surface 368 is positioned to engage with the bottom of the replica M.2 mount 135, with a central threaded portion of the standoff 366 extending through the semi-circular hole of the replica M.2 mount 135.

Figure 28:
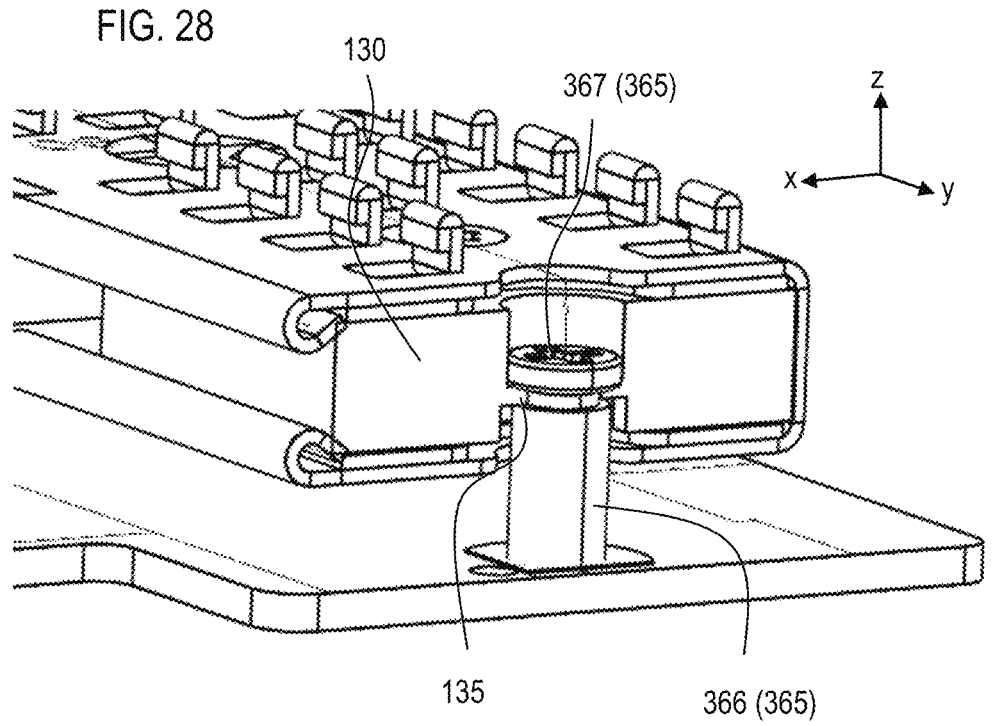
FIG. 28 is a partial perspective view of a portion of the system of FIG. 23 in the third state.

As shown in FIG. 26, the final operation in installing the assembly 185 is engaging the set screw 367 with the standoff 366. This results in the replica M.2 mount 135 being clamped between the set screw 367 and the standoff 366, as shown in FIG. 28 (e.g., the engagement surface 368 of the standoff 366 abuts the bottom side of the replica M.2 mount 135 while the set screw 367 abuts the top side). Thus, in this state, the proximal end of the assembly 185 is connected to the PCA 360 via the engagement between the connectors 151 and 361, whereas the distal end of the assembly 185 is connected to the PCA 360 via the engagement between the PCA fastener 365 and the spacer 130. The spacer 130 is attached to the clip 120, and the clip 120 is attached to the distal end of the M.2 module 150 via the fasteners 140, and therefore both ends of the M.2 module 150 are also connected (directly or indirectly) to and supported by the PCA 360.

Figures 29, 30:
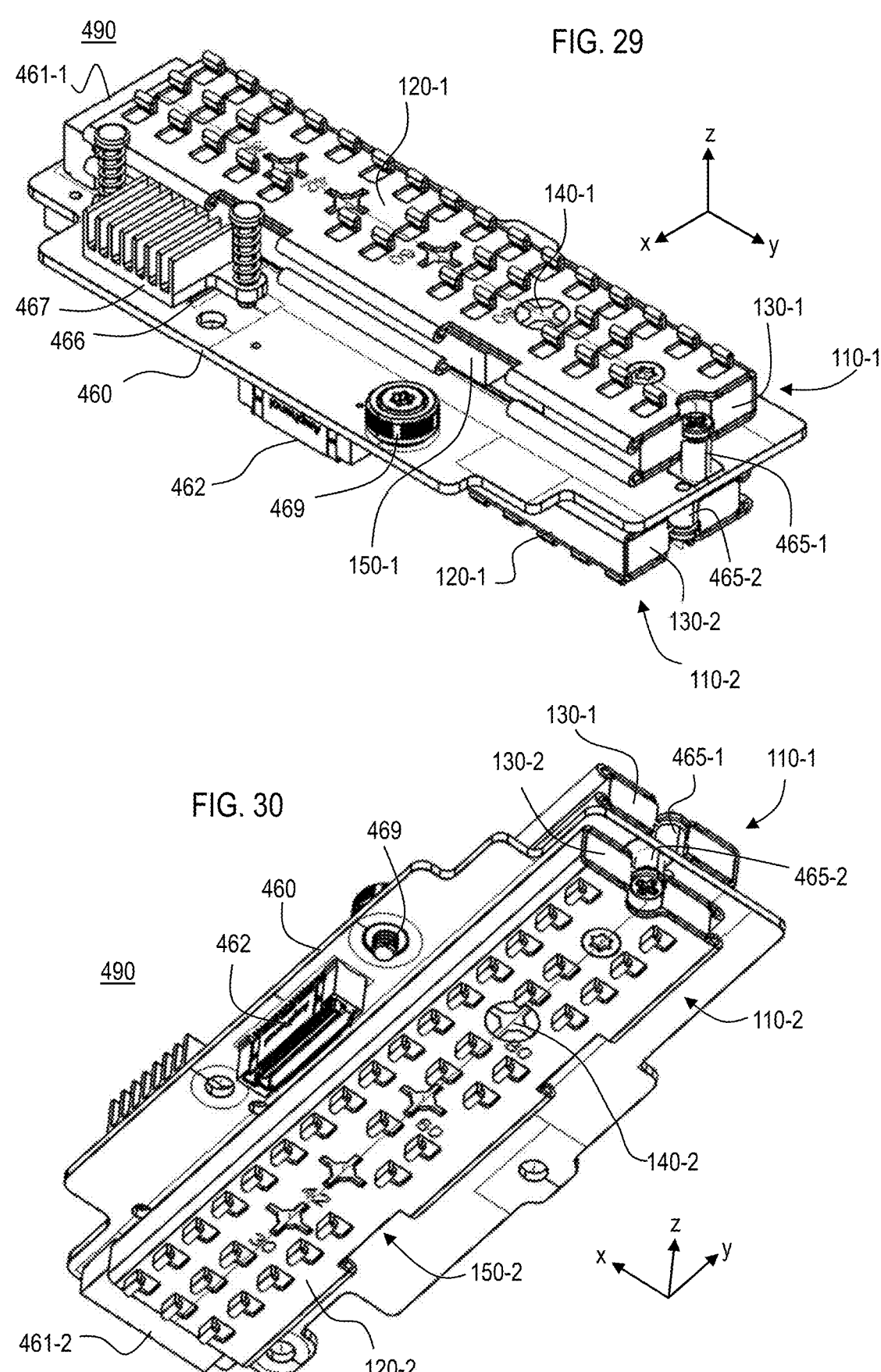
FIG. 29 is a top perspective view of another example system comprising another PCA and two of the M.2 adapter/heatsinks of FIG. 3 each with one of the first M.2 modules installed therein.
FIG. 30 is a bottom perspective view of another example system comprising another PCA and two of the M.2 adapter/heatsinks of FIG. 3 each with one of the first M.2 modules installed therein.

Turning now to FIGS. 29 and 30, an example system 490 is described. The system 490 comprises a PCA 460 and two instances of assemblies comprising the M.2 adapter/heatsink 110 with M.2 modules installed therein. In FIGS. 29 and 30, the M.2 modules that are illustrated are the M.2 modules 150-1 and 150-2, but this is just an illustrative example and any size of M.2 module that is compatible with the M.2 adapter/heatsink 110 can be used in the system 490.

As shown in FIGS. 29 and 30, the first and second M.2 adapter/heatsinks 110-1 and 110-2, and the first and second M.2 modules installed therein, are connected to opposite sides of the PCA 460. As shown in FIG. 29, the PCA 460 comprises a first electrical connector 461-1 on a first side of the PCA 460 connected to the first M.2 module 150-1. In addition, a first PCA fastener 465-1 attached to the first side of the PCA 460 is connected to the spacer 130-1 of the first M.2 adapter/heatsink 110-1, in a similar manner as described above in relation to the system 390. Similarly, as shown in FIG. 30, the PCA 460 comprises a second electrical connector 461-2 on a second side of the PCA 460 connected to the second M.2 module 150-2. In addition, a second PCA fastener 465-2 attached to the second side of the PCA 460 is connected to the spacer 130-2 of the second M.2 adapter/heatsink 110-2, in a similar manner as described above in relation to the system 390. In this manner, two of the assemblies 185 described above can be coupled to opposite sides of the same PCA 460.

In some examples, the PCA 460 comprises a riser card, which is configured to serve as an intermediary to facilitate connection of the M.2 modules 150-1 and 150-2 to another PCA, such as a primary system board of a computing device. Thus, in some examples, the PCA 460 further comprises another connector 462, which is configured to be connected to the other PCA via a complementary connector, which may be mounted on the other PCA or may be attached to a cable which is in turn connected to another connector mounted on the other PCA. In some examples, the PCA 460 may also comprise attachment features 469 to attach the PCA 460 to a supporting structure, such as the other PCA, a riser cage, a chassis of a computing device, etc. The PCA 460 may also comprise some electrical circuitry 466, such as an input/output controller to coordinate communications between the M.2 modules 150-1 and 150-2 and the other PCA 460. The electronic circuitry 466 may have a heat sink 467 attached thereto to assist in cooling.

In some examples, the M.2 adapter/heatsink 110 may beneficially allow the PCA 460 to be designed in a way that is agnostic to the size of the M.2 modules being connected thereto. For example, in some cases only one attachment point for the PCA fasteners 465 needs to be provided on each side of the PCA 460, rather than needing to place multiple attachment points for multiple different sizes of M.2 modules on each side of the PCA 460. It is possible to provide just the one attachment point on each side because the replica M.2 mount 135 is used to attach the assembly 185 to the PCA 460 (assuming one of the smaller M.2 modules are used) and the replica M.2 mount 135 remains at the same location regardless of the size of the M.2 module being used (and if the largest M.2 module 250 is used, then the mount 235 thereof is also located at the same location). Having only a single attachment point per side can simplify the design of the PCA 460 and allow valuable space on the PCA to be utilized by other components.

Thermally Coupled: As used herein, to "thermally couple" two objects means to provide a thermally conductive pathway between the objects that allows heat to be conducted between the objects. Two objects may be considered to be thermally coupled if any of the following are true: (1) the two objects are in contact with one another (either direct contact, or contact via a TIM), (2) the objects are both thermally coupled to a thermally conductive intermediary (e.g., a heat pipe, heat spreader, etc.) (or to a chain of thermally conductive intermediaries thermally coupled together), or (3) a heat transfer coefficient between the two objects is 10 $W \cdot m^{-2} \cdot K^{-1}$ or greater.

Thermally conductive: An object, device, or assembly (which may comprise multiple distinct bodies that are thermally coupled, and may include multiple different materials), is "thermally conductive" between two thermal interfaces if any one of the following is true: (1) a heat transfer coefficient between the thermal interfaces is 10 $W \cdot m^{-2} \cdot K^{-1}$ or greater at any temperature between 0° C. and 100° C., (2) the object is continuous piece of a material that has a thermal conductivity (often denoted k, $\lambda$, or $\kappa$) between the two interfaces of 1 $W \cdot m^{-1} \cdot K^{-1}$ or greater at any temperature between 0° C. and 100° C., (3) the object is a heat pipe, vapor chamber, continuous body of copper, or continuous body of aluminum. Examples of materials whose thermal conductivity is greater than 1 $W \cdot m^{-1} \cdot K^{-1}$ between 0° C. and 100° C. include almost all metals and their alloys (e.g., copper, aluminum, gold, etc.), some plastics (e.g., TECACOMP® TC compounds, CoolPoly® D-series Thermally Conductive Plastics), and many other materials.

Highly thermally conductive: An object, device, or assembly (which may comprise multiple distinct bodies that are thermally coupled, and may include multiple different materials), is "highly thermally conductive" between two thermal interfaces if any one of the following is true: (1) a heat transfer coefficient between the thermal interfaces is 1000 $W \cdot m^{-2} \cdot K^{-1}$ or greater at any temperature between 0° C. and 100° C., (2) the object is continuous piece of a material that has a thermal conductivity (often denoted k, $\lambda$, or $\kappa$) between the two interfaces of 100 $W \cdot m^{-1} \cdot K^{-1}$ or greater at any temperature between 0° C. and 100° C., (3) the object is a heat pipe, vapor chamber, continuous body of copper, or continuous body of aluminum. Examples of materials whose thermal conductivity is 100 $W \cdot m^{-1} \cdot K^{-1}$ or greater between 0° C. and 100° C. include certain types of copper, aluminum, silver, and gold.

In the description above, various types of electronic circuitry are described. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as connected may be electronically or mechanically directly connected, or they may be indirectly connected via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. An M.2 adapter/heatsink, comprising:

a heat spreader clip comprising a top wall, a bottom wall, and a spine extending between the top wall to the bottom wall, the heat spreader clip configured to receive M.2 modules having any of a plurality of M.2 module lengths;

an adapter fastener configured to be selectively attached to the heat spreader clip at any one of a plurality of attachment locations corresponding respectively to the plurality of M.2 lengths except for a longest M.2 length, wherein the adapter fastener is configured to engage an M.2 mount of a given M.2 module received in a space between the top wall and bottom wall in response to the adapter fastener being attached to the heat spreader clip at a given attachment location which corresponds to a length of the given M.2 module out of the plurality of attachment locations; and a spacer configured to be selectively attached to the heat spreader clip in the space between the top wall and bottom wall, wherein the spacer comprises a replica M.2 mount configured to be connected to a printed circuit assembly (PCA) by an PCA fastener.

2. The M.2 adapter/heatsink of claim 1, wherein the replica M.2 mount of the spacer is positioned at a same location relative to the heat spreader clip regardless of which length of M.2 module is received in the heat spreader clip out of the plurality of M.2 module lengths except for the longest M.2 module length.

3. The M.2 adapter/heatsink of claim 2, wherein in a state of an M.2 module having the longest M.2 module length out of the plurality of M.2 module lengths being received in the heat spreader clip, the spacer is not attached to the heat spreader clip, and an M.2 mount of the M.2 module is located at a same location as the replica M.2 mount when the spacer is attached to the heat spreader clip.

4. The M.2 adapter/heatsink of claim 1, further comprising:

a plurality of first fastener holes arranged in the top wall; and a plurality of second fastener holes arranged in the bottom wall, wherein the first and second fastener holes are grouped into pairs each comprising one first fastener hole and one second fastener hole which are aligned with one another, wherein each of the pairs of fastener holes corresponds to one of the attachment locations; and wherein the adapter fastener is configured to attach to the heat spreader clip at any of the attachment locations by engagement with the pair of fastener holes at the respective attachment location.

5. The M.2 adapter/heatsink of claim 4, wherein the adapter fastener comprises a first part configured to engage with the first fastener holes and a second part configured to engage with the second fastener holes;

wherein the adapter fastener is configured to attach to the heat spreader clip at the given attachment location by the first part being inserted downward through the first fastener hole of the pair of fastener holes at the given attachment location and by the second part being inserted upward through the second fastener hole of the pair of fastener holes at the given attachment location.

6. The M.2 adapter/heatsink of claim 5,
wherein the first part and the second part comprise snap-fit features configured to engage with the first and second fastener holes in response to the first part being pressed downward through one of the first holes and in response to the second part being pressed upward through one of the second holes.

7. The M.2 adapter/heatsink of claim 5,
wherein the first part and the second part each comprise engagement features which are configured to engage with opposite sides of the M.2 mount of the given M.2 module in response to the first and second parts being inserted through the pair of fastener holes at the given attachment location.

8. The M.2 adapter/heatsink of claim 1,
wherein the top wall, the bottom wall, or both the top and bottom walls comprises a plurality of protrusions extending from the respective wall.

9. The M.2 adapter/heatsink of claim 8,
wherein the plurality of protrusions comprise folded fins.

10. The M.2 adapter/heatsink of claim 1,
wherein the heat spreader clip is biased to press the top and bottom walls against opposite faces of the given M.2 module when the given M.2 module is received in the heat spreader clip.

11. The M.2 adapter/heatsink of claim 10, comprising:
wire handles configured to be removably installed into receptacles coupled to free ends of the top and bottom walls, wherein the wire handles are configured to, when installed in the receptacles, act as levers with the top and bottom walls as fulcrums, such that squeezing the wire handles together urges the top and bottom walls away from one another in opposition to the biasing.

12. The M.2 adapter/heatsink of claim 1,
wherein the plurality of M.2 module lengths include lengths of 30 mm, 42 mm, 60 mm, 80 mm, and 110 mm.

13. An assembly comprising:
the M.2 adapter/heatsink of claim 1;
a first M.2 module installed in the heat spreader clip;
wherein the first M.2 module has a first length;
wherein the fastener is attached to the heat spreader clip at a first attachment location corresponding to the first length and the fastener is attached to an M.2 mount of the first M.2 module; and
wherein the spacer is attached to the heat spreader clip.

14. A system comprising:
a printed circuit assembly (PCA) comprising a first electrical connector connected to a first side of the PCA;
a first PCA fastener attached to a first side of the PCA;
the assembly of claim 13,
wherein an electrical connector of the first M.2 module is connected to the first electrical connector of the PCA; and
wherein the replica M.2 mount of the spacer of the assembly is engaged with the first PCA fastener to attach the assembly to the PCA.

15. The system of claim 14, comprising:
a second electrical connector connected to a second side of the PCA;
a second PCA fastener attached to a second side of the PCA;
a second assembly comprising:
a second instance of the M.2 adapter/heatsink of claim 1;
a second M.2 module installed in the heat spreader clip of the second instance of the M.2 adapter/heatsink;

wherein an electrical connector of the second M.2 module is connected to the second electrical connector of the PCA; and
wherein the replica M.2 mount of the spacer of the second assembly is engaged with the second PCA fastener to attach the assembly to the PCA.

16. An M.2 adapter/heatsink, comprising:
a heat spreader clip comprising a top wall, a bottom wall, and a spine extending between the top wall to the bottom wall;
a plurality of first fastener holes arranged in the top wall;
a plurality of second fastener holes arranged in the bottom wall, wherein the first and second fastener holes are grouped into pairs each comprising one first fastener hole and one second fastener hole which are aligned with one another, wherein the pairs of fastener holes comprise a first pair of fastener holes and a second pair of fastener holes
an adapter fastener configured to be selectively attached to the heat spreader clip at either the first or second pair of fastener holes; and
a spacer configured to be selectively attached to the heat spreader clip in the space between the top wall and bottom wall, wherein the spacer comprises a replica M.2 mount configured to be connected to a printed circuit assembly (PCA) by an PCA fastener;
wherein the adapter fastener is configured to, in response to a first M.2 module having the first M.2 module length being received in the heat spreader clip, be attached to the first pair of fastener holes and engage an M.2 mount of the first M.2 module,
wherein the adapter fastener is configured to, in response to a second M.2 module having the second M.2 module length being received in the heat spreader clip, be attached to the second pair of fastener holes and engage an M.2 mount of the second M.2 module.

17. The M.2 adapter/heatsink of claim 16,
wherein the adapter fastener comprises a first part configured to engage with the first fastener holes and a second part configured to engage with the second fastener holes;
wherein the adapter fastener is configured to attach to the heat spreader clip at the first pair of fastener holes by the first part being inserted downward through the first fastener hole of the first pair and by the second part being inserted upward through the second fastener hole of the first pair of fastener.

18. The M.2 adapter/heatsink of claim 17,
wherein the first part and the second part comprise snap-fit features configured to engage with the first and second fastener holes in response to the first part being pressed downward through one of the first holes and in response to the second part being pressed upward through one of the second holes.

19. A method, comprising:
providing an M.2 module and an M.2 adapter/heatsink;
inserting the M.2 module into a heat spreader clip of the M.2 adapter/heatsink;
attaching an adapter fastener to the heat spreader clip at an attachment location that corresponds to the length of the M.2 module, out of a plurality of attachment locations provided in the heat spreader clip, wherein attaching the adapter fastener to the heat spreader clip includes attaching the adapter fastener to an M.2 mount of the M.2 module;

attaching a spacer to the heat spreader clip adjacent to the M.2 module;

attaching a replica M.2 mount of the spacer to a printed circuit assembly.

20. The method of claim 19, wherein the heat spreader clip comprises a top wall and a bottom wall, wherein each of the attachment locations comprise a first fastener hole in the top wall and a second fastener hole in the bottom wall;

wherein the adapter fastener comprises a first part comprising snap-fit feature configured to engage with the first fastener holes and a second part comprising snap-fit features configured to engage with the second fastener holes; and wherein attaching the adapter fastener to the heat spreader clip at the attachment location that corresponds to the length of the M.2 module comprise pressing the first part downward through the first fastener hole of the attachment location and pressing the second part upward through the second fastener hole of the attachment location until the first and second parts engage with the M.2 mount of the M.2 module and the snap fit features of the first and second parts engage with the first and second fastener holes, respectively.

\* \* \* \* \*